*(12)* United States Patent
Park et al.

(10) Patent No.: US 10,845,912 B2
(45) Date of Patent: Nov. 24, 2020

(54) DISPLAY DEVICE INCLUDING FORCE SENSOR AND VIBRATION GENERATOR

(71) Applicant: Samsung Display Co., Ltd., Yongin-si (KR)

(72) Inventors: Sung Kook Park, Suwon-si (KR); Suk Kim, Hwaseong-si (KR); So Hee Park, Cheonan-si (KR); Hee Seomoon, Hwaseong-si (KR); Tae Hee Lee, Hwaseong-si (KR); Won Ki Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/360,771

(22) Filed: Mar. 21, 2019

(65) Prior Publication Data

US 2020/0042133 A1 Feb. 6, 2020

(30) Foreign Application Priority Data

Aug. 1, 2018 (KR) .................. 10-2018-0089754

(51) Int. Cl.
  *G06F 3/041* (2006.01)
  *G06F 3/01* (2006.01)
  *G06F 3/0488* (2013.01)

(52) U.S. Cl.
  CPC ............ *G06F 3/0414* (2013.01); *G06F 3/016* (2013.01); *G06F 3/0412* (2013.01); *G06F 3/04883* (2013.01); *G06F 2203/014* (2013.01)

(58) Field of Classification Search
  CPC ...... G06F 3/0414; G06F 3/016; G06F 3/0412; G06F 3/04883
  See application file for complete search history.

(56) References Cited

U.S. PATENT DOCUMENTS

| | | | |
|---|---|---|---|
| 8,421,609 | B2 | 4/2013 | Kim et al. |
| 8,654,524 | B2 | 2/2014 | Pance et al. |
| 8,686,952 | B2 | 4/2014 | Burrough et al. |
| 9,436,225 | B2 | 9/2016 | Shin et al. |
| 2002/0149561 | A1* | 10/2002 | Fukumoto ........ G01C 21/3664 345/156 |
| 2012/0068957 | A1* | 3/2012 | Puskarich ........... G06F 3/016 345/174 |
| 2013/0147738 | A1 | 6/2013 | Lee et al. |

(Continued)

FOREIGN PATENT DOCUMENTS

| KR | 10-2012-0015763 | 2/2012 |
|---|---|---|
| KR | 10-2013-0063831 | 6/2013 |

(Continued)

OTHER PUBLICATIONS

International Search Report dated Apr. 9, 2019, in International Patent Application No. PCT/KR2018/011384.

*Primary Examiner* — Kevin M Nguyen
(74) *Attorney, Agent, or Firm* — H.C. Park & Associates, PLC

(57) ABSTRACT

A display device includes a display panel, a first force sensor, a first vibration generator, and a first electromagnetic wave shielding member. The first force sensor is disposed under the display panel. The first vibration generator is disposed under the display panel and adjacent to the first force sensor. The first electromagnetic wave shielding member surrounds side surfaces of the first vibration generator.

23 Claims, 28 Drawing Sheets

(56) References Cited

U.S. PATENT DOCUMENTS

| | | |
|---|---|---|
| 2014/0028575 A1 | 1/2014 | Parivar et al. |
| 2017/0287992 A1 | 10/2017 | Kwak et al. |
| 2017/0357325 A1* | 12/2017 | Yang .................... G06F 3/0414 |
| 2018/0218859 A1* | 8/2018 | Ligtenberg ............. H01H 13/85 |

FOREIGN PATENT DOCUMENTS

| | | |
|---|---|---|
| KR | 10-2015-0088658 | 8/2015 |
| KR | 10-2017-0111827 | 10/2017 |
| KR | 10-2018-0010952 | 1/2018 |

\* cited by examiner

DISPLAY DEVICE INCLUDING FORCE SENSOR AND VIBRATION GENERATOR

CROSS-REFERENCE TO RELATED APPLICATION

This application claims priority from and the benefit of Korean Patent Application No. 10-2018-0089754, filed Aug. 1, 2018, which is hereby incorporated by reference for all purposes as if fully set forth herein.

BACKGROUND

Field

Exemplary embodiments generally relate to a display device.

Discussion

Electronic devices that present images to a user, such as a smart phone, a tablet personal computer (PC), a digital camera, a laptop computer, a navigation device, a smart television (TV), and the like, include a display device for displaying images. Such a display device may include a display panel for generating and displaying an image and various input means. For example, a touch panel that recognizes a touch input has been widely employed for a display device of a smartphone or a tablet PC. By virtue of its convenience, a touch panel increasingly replaces existing physical input means, such as a keypad. Further, interest in a touch panel to receive a variety of inputs by employing a force sensor on a display device is growing. Also, to realize haptic feedback, a vibration generator may be employed by a display device. Studies have been made to realize such haptic feedback by incorporating a vibration generator into a touch panel or a force sensor.

The above information disclosed in this section is only for understanding the background of the inventive concepts, and, therefore, may contain information that does not form prior art.

Summary

Some exemplary embodiments provide a display device capable of providing haptic feedback by generating vibration only at a part of a display panel where a touch is made or pressure is applied.

Additional aspects will be set forth in the detailed description which follows, and, in part, will be apparent from the disclosure, or may be learned by practice of the inventive concepts.

According to some exemplary embodiments, a display device includes a display panel, a first force sensor, a first vibration generator, and a first electromagnetic wave shielding member. The first force sensor is disposed under the display panel. The first vibration generator is disposed under the display panel and adjacent to the first force sensor. The first electromagnetic wave shielding member surrounds side surfaces of the first vibration generator.

In some exemplary embodiments, an upper surface of the first electromagnetic wave shielding member may be closer to the display panel than an upper surface of the first vibration generator.

In some exemplary embodiments, the display device may further includes a middle frame disposed under the display panel.

In some exemplary embodiments, the first electromagnetic wave shielding member may be between a lower surface of the display panel and an upper surface of the middle frame.

In some exemplary embodiments, the display device may further include a first adhesive layer and a second adhesive layer. The first adhesive layer may be attached to the first electromagnetic wave shielding member. The first adhesive layer may be between a lower surface of the display panel and the first electromagnetic wave shielding member. The second adhesive layer may be attached to the first electromagnetic wave shielding member and an upper surface of the middle frame.

In some exemplary embodiments, the first electromagnetic wave shielding member may protrude from an upper surface of the middle frame, and the display device may further include a third adhesive layer. The third adhesive layer may be attached to the first electromagnetic wave shielding member. The third adhesive layer may be between a lower surface of the display panel and the first electromagnetic wave shielding member.

In some exemplary embodiments, the first vibration generator and the first electromagnetic wave shielding member may be accommodated in a first accommodating hole formed in an upper surface of the middle frame.

In some exemplary embodiments, the first electromagnetic wave shielding member may be between the lower surface of the display panel and a floor surface of the first accommodating hole.

In some exemplary embodiments, the display device may further include a first adhesive layer and a second adhesive layer. The first adhesive layer may be attached to the first electromagnetic wave shielding member. The first adhesive layer may be between a lower surface of the display panel and the first electromagnetic wave shielding member. The second adhesive layer may be attached to the first electromagnetic wave shielding member and an upper surface of the middle frame.

In some exemplary embodiments, the first electromagnetic wave shielding member may protrude from the floor surface of the first accommodating hole.

In some exemplary embodiments, the display device may further include a circuit board connected to a first pad electrode and a second pad electrode of the first vibration generator. The first electromagnetic wave shielding member may be disposed on the circuit board.

In some exemplary embodiments, the first vibration generator may be configured to vibrate in response to detection of a force via the first force sensor.

In some exemplary embodiments, the display device may further include a second force sensor, a second vibration generator, and a second electromagnetic wave shielding member. The second force sensor may be disposed under the display panel. The second vibration generator may be disposed under the display panel and adjacent to the second force sensor. The second electromagnetic wave shielding member may surround side surfaces of the second vibration generator.

In some exemplary embodiments, the first force sensor may be disposed closer to a first side end of the display panel than the first vibration generator, and the second force sensor may be disposed closer to a second side end of the display panel than the second vibration generator. The second side end is different from the first side end.

In some exemplary embodiments, the first vibration generator may be configured to vibrate in response to detection of a force via the first force sensor, and the second vibration generator may be configured to vibrate in response to detection of a force via the second force sensor.

In some exemplary embodiments, a height or width of the first vibration generator may be different from a height or width of the second vibration generator.

In some exemplary embodiments, the display device may further include a third vibration generator and a third electromagnetic wave shielding member. The third vibration generator may be disposed under the display panel and adjacent to the first force sensor. The third electromagnetic wave shielding member may surround side surfaces of the third vibration generator.

In some exemplary embodiments, the first force sensor may include a plurality of force detection cells, the first vibration generator may be disposed adjacent to one of the plurality of force detection cells, and the third vibration generator may be disposed adjacent to another one of the plurality of force detection cells.

In some exemplary embodiments, the first vibration generator may be configured to vibrate in response to detection of a force via one of the plurality of force detection cells, and the third vibration generator may be configured to vibrate in response to detection of a force via another one of the plurality of force detection cells.

In some exemplary embodiments, the display device may further include a first waterproof member disposed under the first force sensor.

In some exemplary embodiments, the first waterproof member may face one side surface of the first electromagnetic wave shielding member.

In some exemplary embodiments, the first electromagnetic wave shielding member may surround at least two side surfaces of the first vibration generator, except one side surface of the first vibration generator.

According to some exemplary embodiments, a display device includes an input device, a display panel, a first vibration generator, and a first electromagnetic wave shielding member. The input device is configured to receive an input from a user. The display panel is configured to display an image. The first vibration generator is disposed under the display panel. The first electromagnetic wave shielding member surrounds side surfaces of the first vibration generator. The first vibration generator is configured to vibrate in response to reception of the input via the input device.

According to some exemplary embodiments, vibration caused by a vibration generator may be blocked by an electromagnetic wave shielding member so that a user can feel the vibration only at a position where the vibration generator is disposed.

According to some exemplary embodiments, when a user's input is received through an input device, one of a plurality of vibration generators that is adjacent to the input device vibrates so that the vibration is generated only at a part of the display device to provide a haptic feedback.

According to some exemplary embodiments, vibration generators may be attached to an upper surface of a middle frame disposed under a display panel, and may be connected to a display circuit board through a circuit board so that the vibration generators, the circuit board, and the middle frame can be implemented as a signal module with the display panel.

According to some exemplary embodiments, an intensity of vibration of one or more vibration generators can be adjusted by increasing a height and width of the vibration generators without increasing a first driving voltage and a second driving voltage.

According to some exemplary embodiments, edges of a lower surface of a display panel may be attached to edges of an upper surface of a middle frame by a plurality of waterproof members. In this manner, it is possible to prevent (or at least reduce) moisture and dust from permeating into an area between the display panel and the middle frame. That is to say, a display device with waterproof and dust-proof capabilities can be produced.

According to some exemplary embodiments, a depression in the form of a notch may be formed in each of a waterproof member and a force sensor so that a cable hole of a middle frame is not covered. Accordingly, a connection cable connected to a display circuit board can be extended to a rear surface of the middle frame through the cable hole, and connected to a main connector of a main circuit board. As a result, a display circuit board can be stably (or more stably) connected to the main circuit board.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
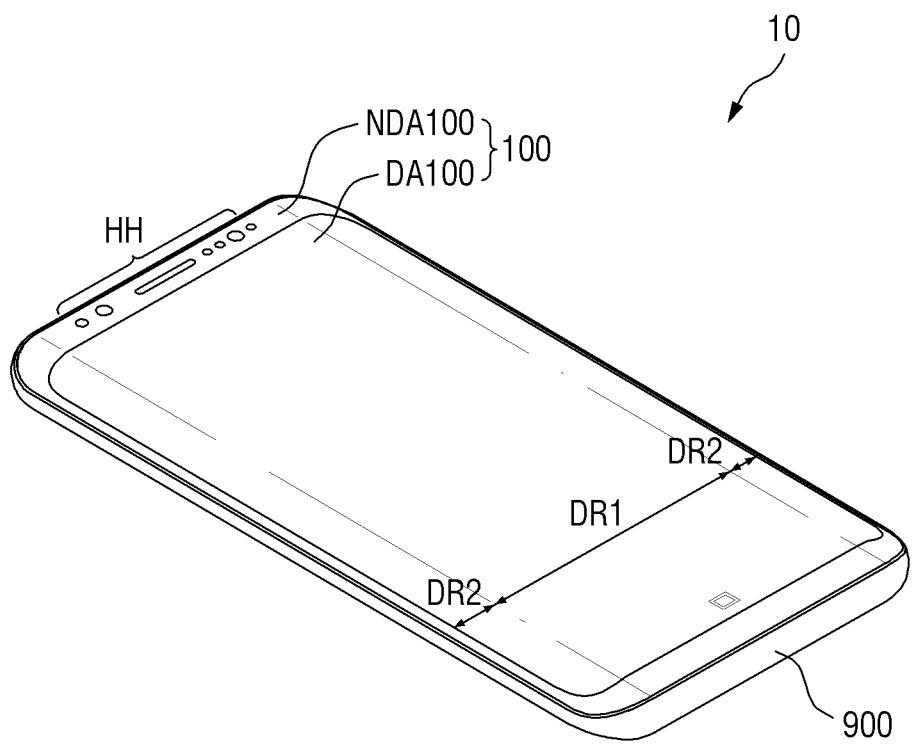
FIG. 1 is a perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced is without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote is like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "bottom," "under," "lower," "above," "top," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the is drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
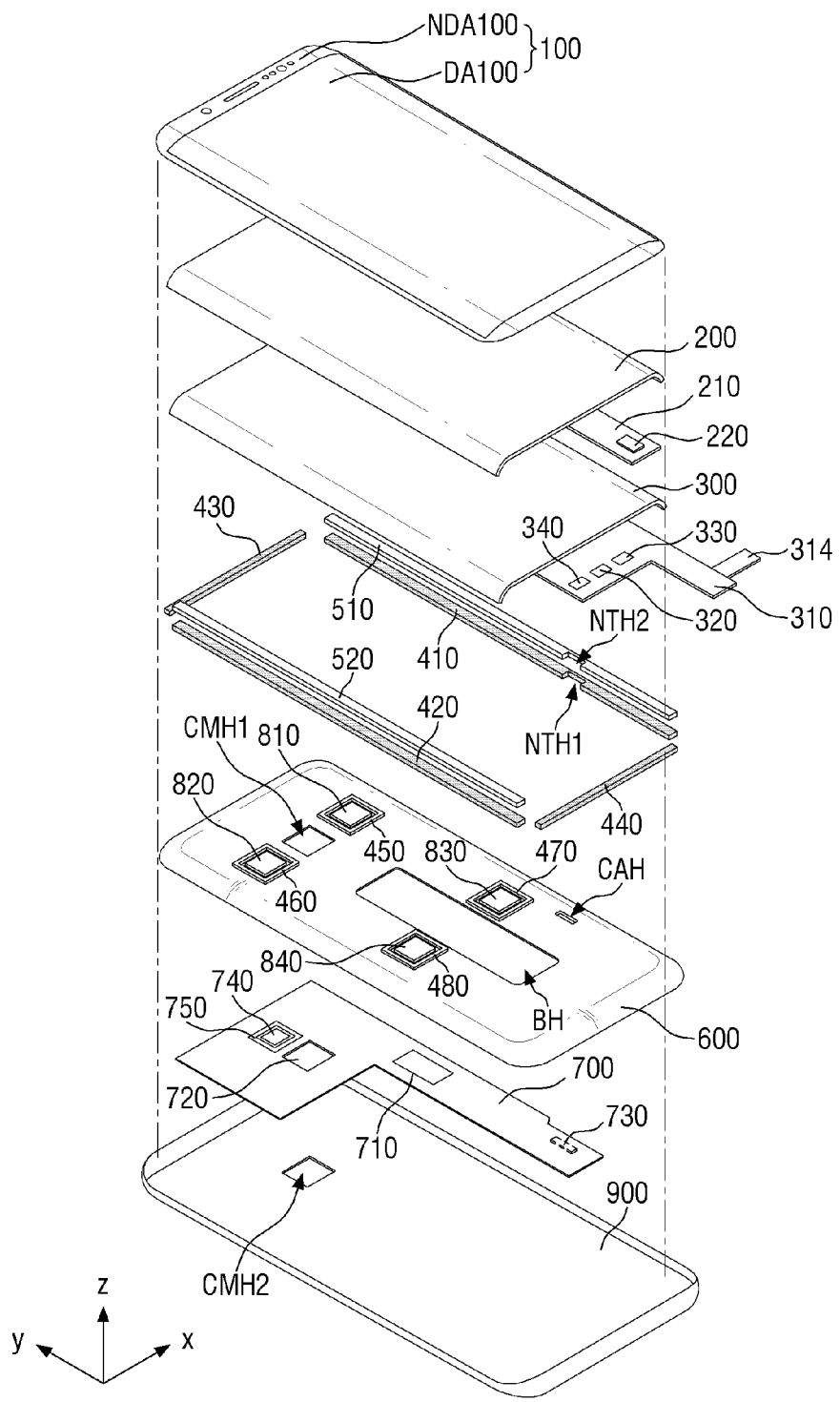
FIG. 2 is an exploded, perspective view of a display device according to some exemplary embodiments.

FIG. 1 is a perspective view of a display device according to some exemplary embodiments. FIG. 2 is an exploded, perspective view of a display device according to some exemplary embodiments.

Referring to FIGS. 1 and 2, a display device 10 according to some exemplary embodiments includes a cover window 100, a touch sensing device 200, a touch circuit board 210, a touch driver 220, a display panel 300, a display circuit board 310, a display driver 320, a first waterproof member 410, a second waterproof member 420, a third waterproof member 430, a fourth waterproof member 440, a first electromagnetic wave shielding member 450, a second electromagnetic wave shielding member 460, a third electromagnetic wave shielding member 470, a fourth electromagnetic wave shielding member 480, a first force sensor 510, a second force sensor 520, a middle frame 600, a main circuit board 700, a first vibration generator 810, a second vibration generator 820, a third vibration generator 830, a fourth vibration generator 840, and a bottom cover 900.

As used herein, the terms "above," "top," and "upper surface" refer to the side of the display panel 300 in the z-axis direction where the cover window 100 is disposed, whereas the terms "below," "bottom," and "lower surface" refer to the opposite side of the display panel 300 in the z-axis direction where the middle frame 600 is disposed. As used herein, the terms "left," "right," "upper," and "lower" indicate relative positions when the display panel 300 is is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

The display device 10 may have a rectangular shape when viewed from the top. For example, the display device 10 may have a rectangular shape having shorter sides in a first direction (e.g., the x-axis direction) and longer sides in a second direction (e.g., the y-axis direction) when viewed from the top as shown in FIGS. 1 and 2. Each of the corners where the short side in the first direction (x-axis direction) meets the longer side in the second direction (y-axis direction) may be rounded with a predetermined curvature or may be a right angle. The shape of the display device 10 when viewed from the top is not limited to a rectangular shape, but may be formed in another polygonal shape, circular shape, elliptical shape, etc.

The display device 10 may include a first area DR1 which is formed flat, and second areas DR2 extended from the right and left sides of the first area DR1. The second areas DR2 may be formed flat or may be curved. When the second areas DR2 are formed flat, the angle formed by the first area DR1 and the second areas DR2 may be an obtuse angle. When the second areas DR2 are formed as curved surfaces, they may have a constant curvature or a varying curvature.

Although the second areas DR2 are extended from the left and right sides of the first area DR1 in FIG. 1, this is merely illustrative. That is to say, the second area DR2 may be extended from only one of the right and left sides of the first area DR1. As another example, the second area DR2 may be extended from at least one of the upper and lower sides of the first area DR1, as well as (or as an alternative to) the left and right sides. In the following description, the is second areas DR2 disposed at the left and right edges of the display device 10, respectively, will be described as an example.

Figure 13:
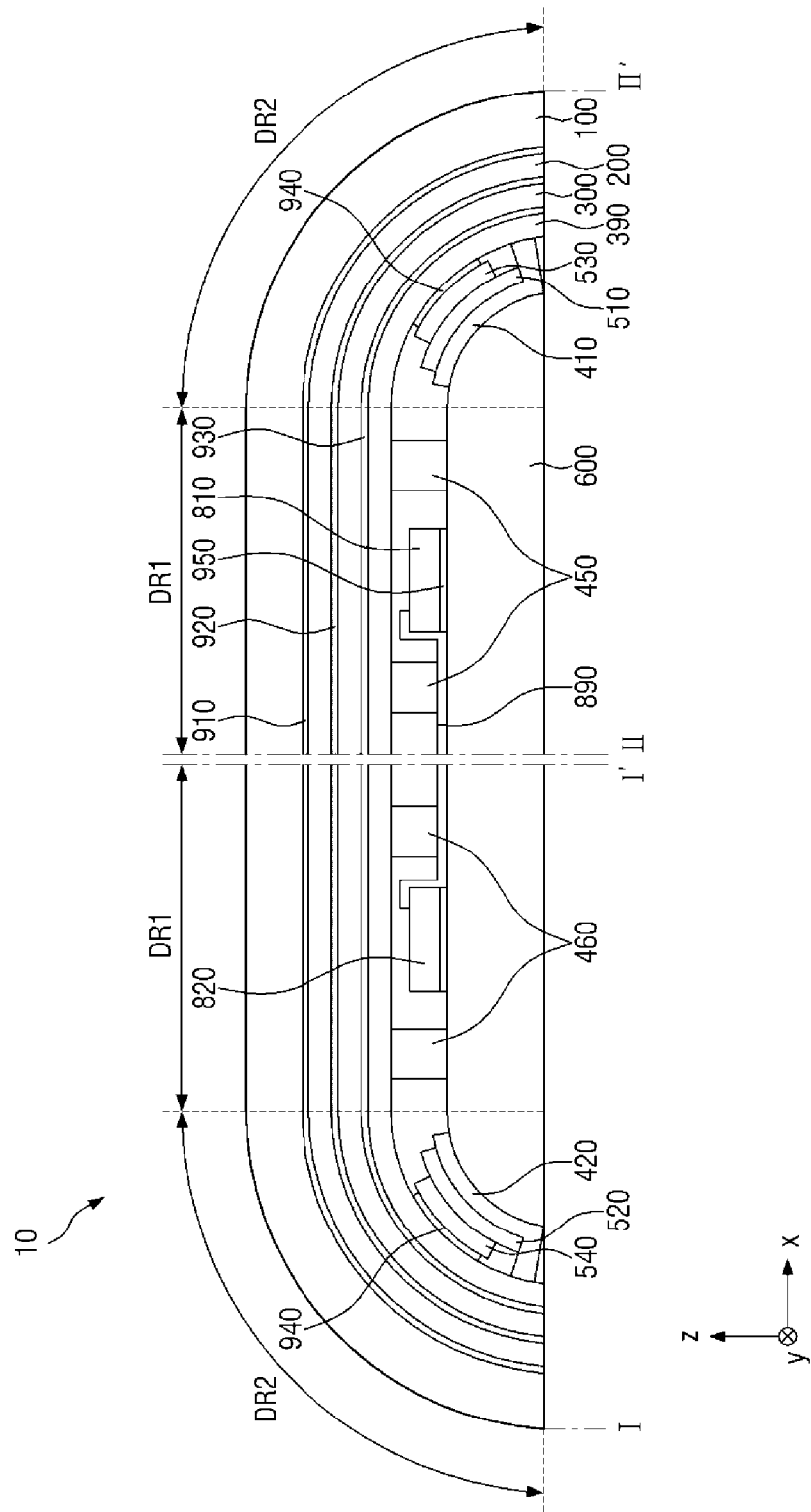
FIG. 13 is a cross-sectional view taken along sectional lines of I-I' and II-II' of FIGS. 3 and 4 according to some exemplary embodiments.

The cover window 100 may be disposed on the display panel 300 to cover the upper surface of the display panel 300. Thus, the cover window 100 can protect the upper surface of the display panel 300. The cover window 100 may be attached to the touch sensing device 200 through a first adhesive member 910 as shown in FIG. 13. The first adhesive member 910 may be an optically cleared adhesive film (OCA) or an optically cleared resin (OCR).

The cover window 100 may include a transmissive portion DA100 corresponding to the display panel 300 and a non-transmissive portion NDA100 corresponding to another area other than the display panel 300. The cover window 100 may be disposed in the first area DR1 and the second areas DR2, and the transmissive portion DA100 may be disposed in a part of the first area DR1 and a part of the second areas DR2. The non-transmissive portion NDA100 may be opaque. As another example, the non-transmissive portion NDA100 may be formed as a decoration layer having a pattern that can be displayed to the user when no image is displayed. For example, a company's logo, such as "SAMSUNG," or various letters may be patterned in the non-transmissive portion NDA100.

Holes HH for exposing various components, e.g., a front camera, a front speaker, an infrared sensor, an ultrasonic sensor, an illuminance sensor, etc., may be formed in the non-transmissive portion NDA100 of the cover window 100. For example, some or all of the front camera, the front speaker, the infrared sensor, the ultrasonic sensor, and the illuminance sensor may be incorporated into (or as part of) the display panel 300, in which case some or all of the holes HH may be removed.

The cover window 100 may be made of any suitable material, such as glass, sapphire, and/or plastic. The cover window 100 may be rigid and/or flexible.

The touch sensing device 200 may be disposed between the cover window 100 and the display panel 300. The touch sensing device 200 may be disposed in the first area DR1 and the second areas DR2. Therefore, a user's touch (or touch interaction) can be detected not only in the first area DR1, but also in the second areas DR2.

The touch sensing device 200 may be attached to the lower surface of the cover window 100 through the first adhesive member 910. A polarizing film (not shown) may be added on the touch sensing device 200 to avoid decreasing visibility otherwise due to reflection of external light. The polarizing film may be attached to the lower surface of the cover window 100 through the first adhesive member 910.

The touch sensing device 200 is an element for sensing a user's touch position. For instance, the touch sensing device 200 may be implemented as a capacitive touch sensing device of a self-capacitance type or a mutual capacitance type. When the touch sensing device 200 is of a self-capacitance type, the touch sensing device 200 may include only touch driving electrodes. On the other hand, when the touch sensing device 200 is of a mutual capacitance type, the touch sensing device 200 may include touch driving electrodes and touch sensing electrodes. In the following description, a mutual capacitive type touch sensing device will be described as an example.

The touch sensing device 200 may be in the form of panel or film. The touch sensing device 200 may be attached to a thin-film encapsulation layer (not shown) of the display panel 300 through the second adhesive member 920 as shown in FIG. 13. The second adhesive member 920 may be a transparent adhesive film (OCA) or a transparent adhesive resin (OCR).

In some exemplary embodiments, the touch sensing device 200 may be formed integrally with the display panel 300. In this case, the touch driving electrodes and the touch sensing electrodes of the touch sensing device 200 may be formed on the thin-film encapsulation layer of the display panel 300.

A touch circuit board 210 may be attached to one side of the touch sensing device 200. For instance, the touch circuit board 210 may be attached to pads disposed on one side of the touch sensing device 200 using an anisotropic conductive film. In addition, a touch connection portion may be provided at one end of the touch circuit board 210, and the touch connection portion may be connected to the connector of the display circuit board 310. The touch circuit board may be a flexible printed circuit board.

The touch driver 220 may apply touch driving signals to the touch driving electrodes of the touch sensing device 200, may sense sensing signals from the touch sensing electrodes of the touch sensing device 200, and may calculate (or determine) a user's touch position by analyzing the sensing signals. The touch driver 220 may be formed as an integrated circuit and mounted on the touch circuit board 210.

The display panel 300 may be disposed under the touch sensing device 200. The display panel 300 may overlap the transmissive portion DA100 of the cover window 100. The display panel 300 may be disposed in the first area DR1 and the second areas DR2. As such, an image on the display panel 300 may be seen not only in the first area DR1, but also in the second areas DR2.

The display panel 300 may be a light-emitting display panel including a light-emitting element; however, exemplary embodiments are not limited thereto. For example, the display panel 300 may include an organic light-emitting display panel using organic is light-emitting diodes, a micro light-emitting diode display panel using micro light-emitting diodes, and a quantum-dot light-emitting display panel including quantum-dot light-emitting diodes.

Although not illustrated in detail, the display panel 300 may include a substrate, a thin-film transistor layer disposed on the substrate, a light-emitting element layer, and a thin-film encapsulation layer.

Since the display panel 300 may be flexible, it can be formed of plastic. As such, the substrate may include a flexible substrate and a support substrate. Because the support substrate supports the flexible substrate, it may be less flexible than the substrate. Each of the flexible substrate and the support substrate may include a flexible polymer material; however, any suitable material may be utilized. For example, each of the flexible substrate and the support substrate may be polyethersulfone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), etc., or any suitable combination thereof.

A thin-film transistor layer is disposed on the substrate. The thin-film transistor layer may include scan lines, data lines, and thin-film transistors. Each of the thin-film transistors includes a gate electrode, a semiconductor layer, and source and drain electrodes. When a scan driver is formed directly on the substrate, it may be formed together with the thin-film transistor layer.

The light-emitting element layer is disposed on the thin-film transistor layer. The light-emitting element layer includes anode electrodes, an emissive layer, a cathode electrode, and banks. The emissive layer may include an organic emissive layer containing an is organic material. For example, the emissive layer may include a hole injection layer, a hole transporting layer, an organic light-emitting layer, an electron transporting layer, and an electron injection layer. The hole injection layer and the electron injection layer may be omitted. When a voltage is applied to the anode electrode and the cathode electrode, the holes and electrons move to the organic emissive layer through the hole transporting layer and the electron transporting layer, respectively, such that they combine in the organic emissive layer to emit light. The light-emitting element layer may be a pixel array layer where pixels are formed. Accordingly, the region where the light-emitting element layer is formed may be defined as a display area for displaying images. The peripheral area of the display area may be defined as a non-display area.

An encapsulation layer (or thin film encapsulation layer) is disposed on the light-emitting element layer. The encapsulation layer serves to prevent permeation of oxygen or moisture into the light-emitting element layer. The encapsulating layer may include at least one inorganic layer and at least one organic layer.

The display circuit board 310 may be attached to one side of the display panel 300. For instance, the display circuit board 310 may be attached to pads disposed on one side of the display panel 300 using an anisotropic conductive film. The touch circuit board 210 may also be bent toward the lower surface of the display panel 300, and the touch connection portion disposed at one end of the touch circuit board 210 may be connected to the connector of the display circuit board 310. The display circuit board 310 will be described in more detail with reference to FIGS. 3 and 4.

The display driver 320 outputs signals and voltages for driving the display panel 300 through the display circuit board 310. The display driver 320 may be formed as an is integrated circuit and mounted on the display circuit board 310, but is not limited thereto. For example, the display driver 320 may be attached to one side of the upper surface or the lower surface of the substrate of the display panel 300.

A panel support member 390 may be disposed under the display panel 300 as shown in FIG. 13. The panel support member 390 may be attached to the lower surface of the display panel 300 through a third adhesive member 930. The third adhesive member 930 may be a transparent adhesive film (OCA) or a transparent adhesive resin (OCR).

The panel support member 390 may include at least one of a light-absorbing member for absorbing light incident from outside, a buffer member for absorbing external impact, a heat dissipating member for efficiently discharging heat from the display panel 300, and a light-blocking layer for blocking light incident from outside.

The light-absorbing member may be disposed under the display panel 300. The light-absorbing member blocks the transmission of light to prevent elements disposed under the light-absorbing member from being seen from above the display panel 300, such as the first waterproof member 410, the first force sensor 510, the second waterproof member 420, the second force sensor 520, and the display circuit board 310. The light-absorbing member may include a light absorbing material, such as a black pigment or a dye.

The buffer member may be disposed under the light-absorbing member. The buffer member absorbs an external impact to prevent (or at least reduce the likelihood of) the display panel 300 from being damaged. The buffer member may be made up of a single layer or multiple layers. For example, the buffer member may be formed of a polymer resin, such as polyurethane, polycarbonate, polypropylene, polyethylene, etc., or may be formed of a material having elasticity, such as a rubber and a sponge obtained by foaming a urethane-based material is or an acrylic-based material. The buffer member may be a cushion layer.

The heat dissipating member may be disposed under the buffer member. The heat dissipation member may include a first heat dissipation layer including graphite or carbon nanotubes, and a second heat dissipation layer formed of a thin metal film, such as copper, nickel, ferrite, silver, etc., which can block electromagnetic waves and have high thermal conductivity.

The first waterproof member 410, the second waterproof member 420, the first force sensor 510, and the second force sensor 520 may be disposed in the second area DR2. That is to say, the first waterproof member 410 and the first force sensor 510 may be disposed under the display panel 300 at the right edge (or side portion) of the display panel 300. The second waterproof member 420 and the second force sensor 520 may be disposed under the display panel 300 at the left edge (or side portion) of the display panel 300. The first force sensor 510 may face the second force sensor 520, and the first waterproof member 410 may face the second waterproof member 420.

The first force sensor 510 may be attached to the lower surface of the panel support member 390. The first waterproof member 410 may be attached to the lower surface of the first force sensor 510. Additionally, the first waterproof member 410 may be attached to at least one side of the first force sensor 510 so as to prevent (or at least reduce) moisture or dust from permeating between the display panel 300 and the first force sensor 510. At least one side of the first force sensor 510 may be a side adjacent to the right edge of the display panel 300.

The second force sensor 520 may be attached to the lower surface of the panel support member 390. The second waterproof member 420 may be attached to the lower surface of the second force sensor 520. Additionally, the second waterproof member 420 may be is attached to at least one side of the second force sensor 520 so as to prevent (or at least reduce) moisture or dust from permeating between the display panel 300 and the second force sensor 520. At least one side of the second force sensor 520 may be a side adjacent to the left edge of the display panel 300.

In addition, the third waterproof member 430 is disposed under the display panel 300 at the upper edge (or side portion) of the display panel 300. The fourth waterproof member 440 is disposed under the display panel 300 at the lower edge (or side portion) of the display panel 300. The third waterproof member 430 may face the fourth waterproof member 440.

Since the gap between the display panel 300 and the middle frame 600 is larger at the left edge and the right edge than at the upper edge and the lower edge, the height of the first waterproof member 410 and the height of the second waterproof member 420 may be greater than the height of the third waterproof member 430 or the height of the fourth waterproof member 440.

To prevent (or at least reduce) moisture or dust from permeating, a waterproof resin layer may be formed between the first waterproof member 410 and the third waterproof member 430, between the first waterproof member 410 and the fourth waterproof member 440, between the second waterproof member 420 and the third waterproof member 430, and between the second waterproof member 420 and the fourth waterproof member 440.

Each of the first waterproof member 410, the second waterproof member 420, the third waterproof member 430, and the fourth waterproof member 440 includes a base film, a first adhesive film disposed on a surface of the base film, and a second adhesive film disposed on the other surface of the base film. The base film may be a polyethylene terephthalate (PET), a polyethylene terephthalate (PET), and a cushion layer, or a polyethylene foam (PE-foam). The first adhesive film and the second adhesive film may be pressure sensitive adhesive (PSA).

As shown in FIGS. 1 and 2, the edges of the lower surface of the display panel 300 are attached to the edges of the upper surface of the middle frame 600 by the first waterproof member 410, the second waterproof member 420, the third waterproof member 430 and the fourth waterproof member 440. Accordingly, it is possible to prevent (or at least reduce) moisture and dust from permeating between the display panel 300 and the middle frame 600. That is to say, the display device 10 with waterproof and dustproof capabilities can be produced.

Figure 3:
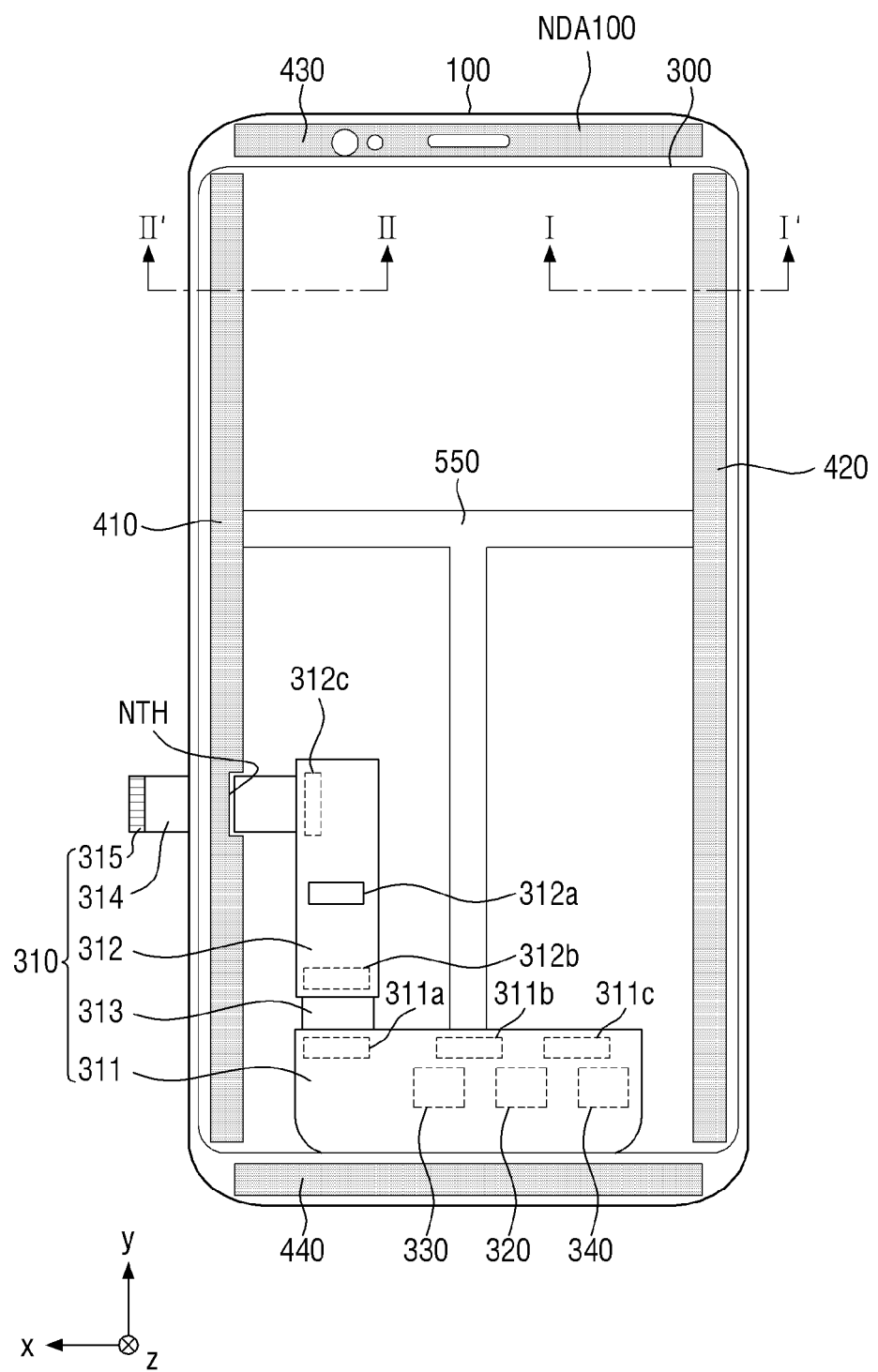
FIG. 3 is a bottom view of a display panel attached a cover window according to some exemplary embodiments.
Figure 8:
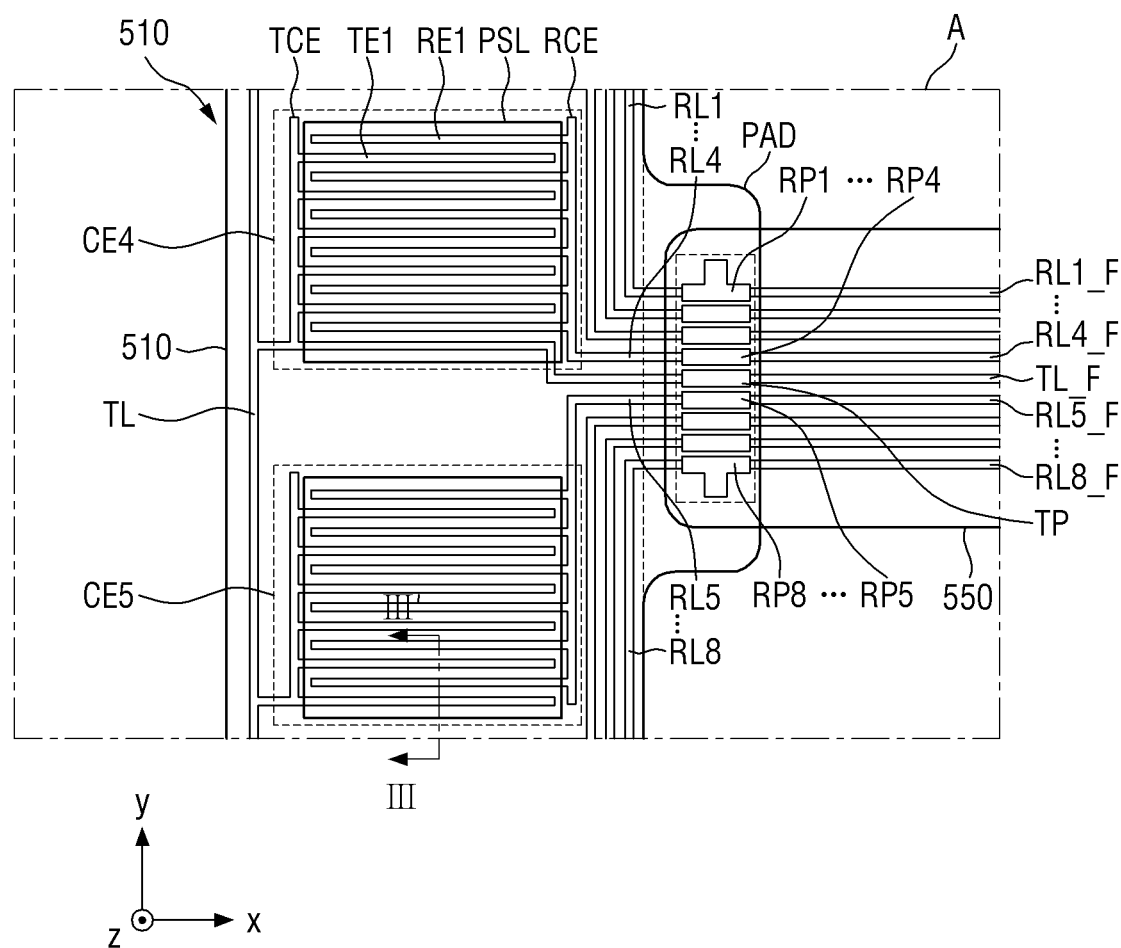
FIG. 8 is an enlarged, plan view of area A shown in FIG. 7 according to some exemplary embodiments.

The first force sensor 510 and the second force sensor 520 may be connected to the display circuit board 310 via a third circuit board 550 (see FIG. 8). Although FIGS. 3 and 8 show that the first force sensor 510 and the second force sensor 520 are connected to the third circuit board 550, exemplary embodiments are not limited thereto. For instance, the display device 10 may include more than one third circuit board 550, such that the first force sensor 510 may be connected to the display circuit board 310 via one third circuit board 550, and the second force sensor 520 may be connected to the display circuit board 310 via another third circuit board 550.

As shown in FIGS. 2 and 3, a force sensing unit 330 for sensing the force by driving the first force sensor 510 and the second force sensor 520 may be mounted on the display circuit board 310. The force sensing unit 330 may be implemented as an integrated circuit. The force sensing unit 330 may be integrated with the display driver 320 to form a single integrated circuit.

In some exemplary embodiments, the third circuit board 550 may be connected to the touch circuit board 210 rather than the display circuit board 310. Then, the force sensing unit 330 may be mounted on the touch circuit board 210. The force sensing unit 330 may be is integrated with the touch driver 220 to form a single integrated circuit.

The middle frame 600 may be disposed below the panel support member 390. The middle frame 600 may include a synthetic resin, a metal, or both a synthetic resin and a metal.

In the middle frame 600, a first camera hole CMH1 for inserting a camera device 720, a battery hole BH for dissipating heat from a battery, and a cable hole CAH through which a second connection cable 314 connected to the display circuit board 310 passes. The cable hole CAH may be disposed in the second area DR2. For instance, the cable hole CAH may be disposed at (or near) the right edge of the middle frame 600, and may be covered by the first waterproof member 410 and the first force sensor 510 disposed under the display panel 300 at the right edge of the display panel 300. Accordingly, the first waterproof member 410 and the first force sensor 510 may include depressions NTH in the form of a notch for exposing the cable hole CAH as shown in FIG. 2.

In addition, the middle frame 600 is disposed below the panel support member 390 of the display panel 300, the first waterproof member 410, the second waterproof member 420, the third waterproof member 430, the fourth waterproof member 440, the first force sensor 510, and the second force sensor 520. Accordingly, the middle frame 600 can support the first force sensor 510 and the second force sensor 520 when a pressure is applied to at least one of the first force sensor 510 and the second force sensor 520. Accordingly, the first force sensor 510 and the second force sensor 520 can sense the applied force.

The plurality of vibration generators (e.g., first to fourth vibration generators 810, 820, 830, and 840) may be disposed on the middle frame 600. The side surfaces of each of the plurality of vibration generators may be surrounded by the electromagnetic wave shielding is members (e.g., first to fourth electromagnetic wave shielding members 450, 460, 470, and 480). In the following description, four vibration generators are disposed on the middle frame 600 for convenience of illustration, but exemplary embodiments are not limited thereto.

The first vibration generator 810, the second vibration generator 820, the third vibration generator 830, and the fourth vibration generator 840 are disposed on the middle frame 600, e.g., disposed on the upper surface of the middle frame 600. The first vibration generator 810 and the third vibration generator 830 may be disposed adjacent to the first force sensor 510, and the second vibration generator 820 and the fourth vibration generator 840 may be disposed adjacent to the second force sensor 520.

The first force sensor 510 may be disposed closer to a first side end of the display panel 300 or the middle frame 600 than the first vibration generator 810 and the third vibration generator 830. The second force sensor 520 may be disposed closer to a second side end of the display panel 300 or the middle frame 600 than the second vibration generator 820 and the fourth vibration generator 840. As shown in FIG. 2, the first side of the display panel 300 or the middle frame 600 may be the right side, whereas the second side of the display panel 300 or the middle frame 600 may be the left side. In addition, the first vibration generator 810 may be disposed closer to the upper side than the third vibration generator 830, and the second vibration generator 820 may be disposed closer to the upper side than the fourth vibration generator 840.

The first vibration generator 810, the second vibration generator 820, the third vibration generator 830, and the fourth vibration generator 840 may be connected to a vibration driver 340 of the display circuit board 310 via the fourth circuit board 890. Although the first vibration generator 810, the second vibration generator 820, the third vibration generator 830, and the fourth vibration generator 840 are connected to a single fourth circuit board 890 in FIG. 4, exemplary embodiments are not limited thereto. That is to say, the display device 10 may include more than one fourth circuit board 890, and the first vibration generator 810, the second vibration generator 820, the third vibration generator 830, and the fourth vibration generator 840 may be connected to the display circuit board 310 through different fourth circuit boards 890, respectively. For instance, two of the first vibration generator 810, the second vibration generator 820, the third vibration generator 830, and the fourth vibration generator 840 may be connected to the display circuit board 310 via one fourth circuit board 890, and the other two of the first vibration generator 810, the second vibration generator 820, the third vibration generator 830, and the fourth vibration generator 840 may be connected to the display circuit board 310 via another fourth circuit board 890.

As shown in FIGS. 2 and 3, the vibration driver 340 for driving the first vibration generator 810, the second vibration generator 820, the third vibration generator 830, and the fourth vibration generator 840 may be mounted on the display circuit board 310. The vibration driver 340 may be formed as an integrated circuit. As another example, the vibration driver 340 may be mounted on the fourth circuit board 890.

The vibration driver 340 may generate first driving voltages and second driving voltages for driving each of the first vibration generator 810, the second vibration generator 820, the third vibration generator 830, and the fourth vibration generator 840 in response to vibration data received from a main processor 710. The vibration data from the main processor 710 may be transmitted to the vibration driver 340 via the second connection cable 314 of the main circuit board 700 and the display circuit board 310, the second circuit board 312, the first connection cable 313, and the first circuit board 311. The first driving voltages and the second driving voltages of the vibration driver 340 may be applied to the first vibration generator 810, the is second vibration generator 820, the third vibration generator 830, and the fourth vibration generator 840 via the first circuit board 311 and the fourth circuit board 890 of the display circuit board 310.

The vibration driver 340 may include a digital signal processor (DSP) for processing the vibration data, which is a digital signal, a digital-analog converter (DAC) for converting the vibration data processed by the digital signal processor in the form of a digital signal into the first driving voltages and the second driving voltages in the form of an analog signal, and an amplifier (AMP) for amplifying the first driving voltages and the second driving voltages converted by the digital-analog converter in the form of an analog signal to output the amplified first driving voltages and the amplified second driving voltages.

The main processor 710 may control the first to fourth vibration generators 810, 820, 830, and 840 so that they have different vibration intensities and/or vibration cycles. For example, the first vibration generator 810 may vibrate with the highest intensity, the second vibration generator 820 may vibrate with the second highest intensity, the third vibration generator 830 may vibrate with the third highest intensity, and the fourth vibration generator 840 may vibrate with the lowest intensity. As another example, the first vibration generator 810 may vibrate with the highest cycle, the second vibration generator 820 may vibrate with the second highest cycle, the third vibration generator 830 may vibrate with the third highest cycle, and the fourth vibration generator 840 may vibrate with the lowest cycle.

In addition, each of the first vibration generator 810, the second vibration generator 820, the third vibration generator 830, and the fourth vibration generator 840 may be implemented as a sound generator that can generate sound by vibration. The first vibration generator 810, the second vibration generator 820, the third vibration generator 830, and the is fourth vibration generator 840 will be described in more detail with reference to FIGS. 10 to 12.

The first electromagnetic wave shielding member 450 may be disposed to surround the side surfaces of the first vibration generator 810 to prevent vibration generated by the first vibration generator 810 from propagating. The second electromagnetic wave shielding member 460 may be disposed to surround the side surfaces of the second vibration generator 820 to prevent vibration generated by the second vibration generator 820 from propagating. The third electromagnetic wave shielding member 470 may be disposed to surround the side surfaces of the third vibration generator 830 to prevent vibration generated by the third vibration generator 830 from propagating. The fourth electromagnetic wave shielding member 480 may be disposed to surround the side surfaces of the fourth vibration generator 840 to prevent vibration generated by the fourth vibration generator 840 from propagating.

Figure 4:
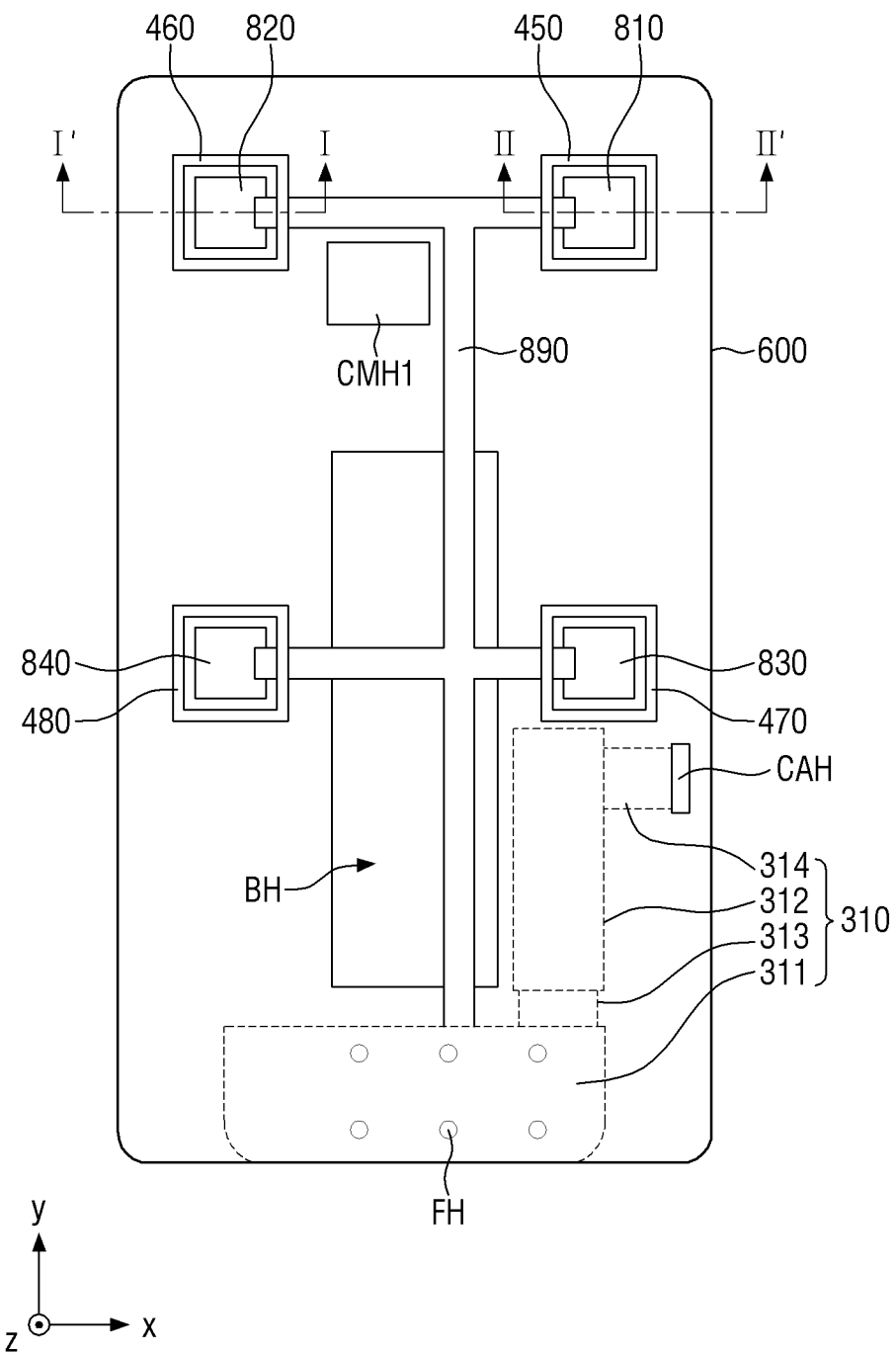
FIG. 4 is a plan view of a middle frame according to some exemplary embodiments.

In FIGS. 2 and 4, the first vibration generator 810 has a rectangular shape when viewed from the top and the first electromagnetic wave shielding member 450 surrounds all of the side surfaces of the first vibration generator 810; however, exemplary embodiments are not limited thereto. When the first vibration generator 810 is disposed at a corner of the middle frame 600, the first electromagnetic wave shielding member 450 may be disposed to surround two side surfaces of the first vibration generator 810. In addition, when the first vibration generator 810 is disposed at the edge of left side, an upper side, or a lower side of the middle frame 600, the first electromagnetic wave shielding member 450 may be disposed to surround three side surfaces of the first vibration generator 810. Each of the second to fourth electromagnetic wave shielding members 460, 470, and 480 may also be formed to surround two, three, or all side surfaces of the respective second to fourth vibration generators 820, 830, and 840 substantially in the same manner as the first vibration generator 810 depending on where is the respective second to fourth vibration generators 820, 830, and 840 are disposed.

As seen in FIGS. 1 and 2, vibration generated by the first vibration generator 810 can be blocked by the first electromagnetic wave shielding member 450. Accordingly, when the first vibration generator 810 vibrates, a user can feel the vibration only at the position where the first vibration generator 810 is disposed. Likewise, the user may feel vibration generated by the second vibration generator 820, vibration generated by the third vibration generator 830, or vibration generated by the fourth vibration generator 840 only at the position where the respective second to fourth vibration generators 820, 830, and 840 are disposed.

The main circuit board 700 may be disposed under the middle frame 600. The main circuit board 700 may be a printed circuit board or a flexible printed circuit board. In some exemplary embodiments, the main circuit board 700 may include a main processor 710, a camera device 720, a main connector 730, a fifth vibration generator 740, and a fifth electromagnetic wave shielding member 750.

The main processor 710 may be disposed on the surface of the main circuit board 700 facing the middle frame 600, whereas the main connector 730 may be disposed on the other surface of the main circuit board 700 facing the bottom cover 900. In addition, the camera device 720 may be disposed on either surface of the main circuit board 700 such that the upper surface of the camera device 720 is disposed on the other surface of the main circuit board 700, and the lower surface of the camera device 720 is disposed on one surface of the main circuit board 700.

The main processor 710 may control all or some of the functions of the display device 10. For example, the main processor 710 may output image data to the display driver 320 of the display circuit board 310 so that the display panel 300 displays an image. In addition, the main processor 710 may receive touch data from the touch driver 220 to determine the position of the user's touch, and may execute an application indicated by an icon displayed at the position of the user's touch. In addition, the main processor 710 may receive force sensing data from the touch driver 220 or the display driver 320 and may output a home screen, may control the volume of sound of the display device 10, may achieve haptic feedback in response to the force sensing data, and/or the like. In addition, the main processor 710 may output to the vibration driver 340 vibration data for vibrating the first vibration generator 810, the second vibration generator 820, the third vibration generator 830, and/or the fourth vibration generator 840, and may output the vibration signal for vibrating the fifth vibration generator 740.

The main processor 710 may be an application processor, a central processing unit, or a system chip implemented as an integrated circuit.

The camera device 720 processes image frames, such as still image and video obtained by the image sensor in the camera device 720, and outputs the image frames to the main processor 710.

The second connection cable 314 passing through the cable hole CAH of the middle frame 600 may be connected to the main connector 730 disposed on the lower surface of the main circuit board 700 via a gap GAP between the middle frame 600 and the main circuit board 700. Accordingly, the main circuit board 700 may be electrically connected to the display circuit board 310 and the touch circuit board 210.

The fifth vibration generator 740 may be a vibration generator, such as an eccentric rotating mass (ERM), a linear resonant actuator (LRA), or a piezo actuator. The fifth vibration generator 740 may generate vibration in response to a vibration signal received from the main processor 710. Although the fifth vibration generator 740 is disposed on (or near) the is upper edge of the main circuit board 700 in FIG. 2, exemplary embodiments are not limited thereto.

The fifth electromagnetic wave shielding member 750 may be disposed to surround the side surfaces of the fifth vibration generator 740 to prevent vibration generated by the fifth vibration generator 740 from propagating. The fifth electromagnetic wave shielding member 750 shown in FIG. 2 surrounds all the side surfaces of the fifth vibration generator 740, but exemplary embodiments are not limited thereto. When the fifth vibration generator 740 is disposed at a corner of the main circuit board 700, the fifth electromagnetic wave shielding member 750 may be disposed to surround two side surfaces of the fifth vibration generator 740. In addition, when the fifth vibration generator 740 is disposed at (or near) the edge of left side, an upper side, or a lower side of the main circuit board 700, the fifth electromagnetic wave shielding member 750 may be disposed to surround three side surfaces of the fifth vibration generator 740.

The fifth electromagnetic wave shielding member 750 may be made of a waterproof member (or material), such as at least one of plastic, steel, and a waterproof tape. In order to block (e.g., effectively block) the vibration by the fifth vibration generator 740 by the fifth electromagnetic wave shielding member 750, the fifth electromagnetic wave shielding member 750 may be disposed on the upper surface of the main circuit board 700 and the lower surface of the middle frame 600.

In some exemplary embodiments, a mobile communications module capable of transmitting/receiving a wireless signal to/from at least one of a base station, an external terminal, and a server over a mobile communications network may be further mounted on the main circuit board 700. The wireless signal may include various types of data depending on a is voice signal, a video call signal, and/or a text/multimedia message transmission/reception. In addition, an acoustic output device capable of outputting sound, and a vibration generator capable of generating vibration for haptic feedback may be further mounted on the main circuit board 700.

The bottom cover 900 may be disposed below the middle frame 600 and the main circuit board 700. The bottom cover 900 may be fastened and fixed to the middle frame 600.

The bottom cover 900 may form the exterior of the lower surface of the display device 10. The bottom cover 900 may include plastic and/or metal. A second camera hole CMH2 may be formed in the bottom cover 900 through which the camera device 720 may be inserted to protrude to the outside. The positions of the camera device 720 and the first and second camera holes CMH1 and CMH2 in line with the camera device 720 are not limited to those shown in FIGS. 1-5.

Figure 5:
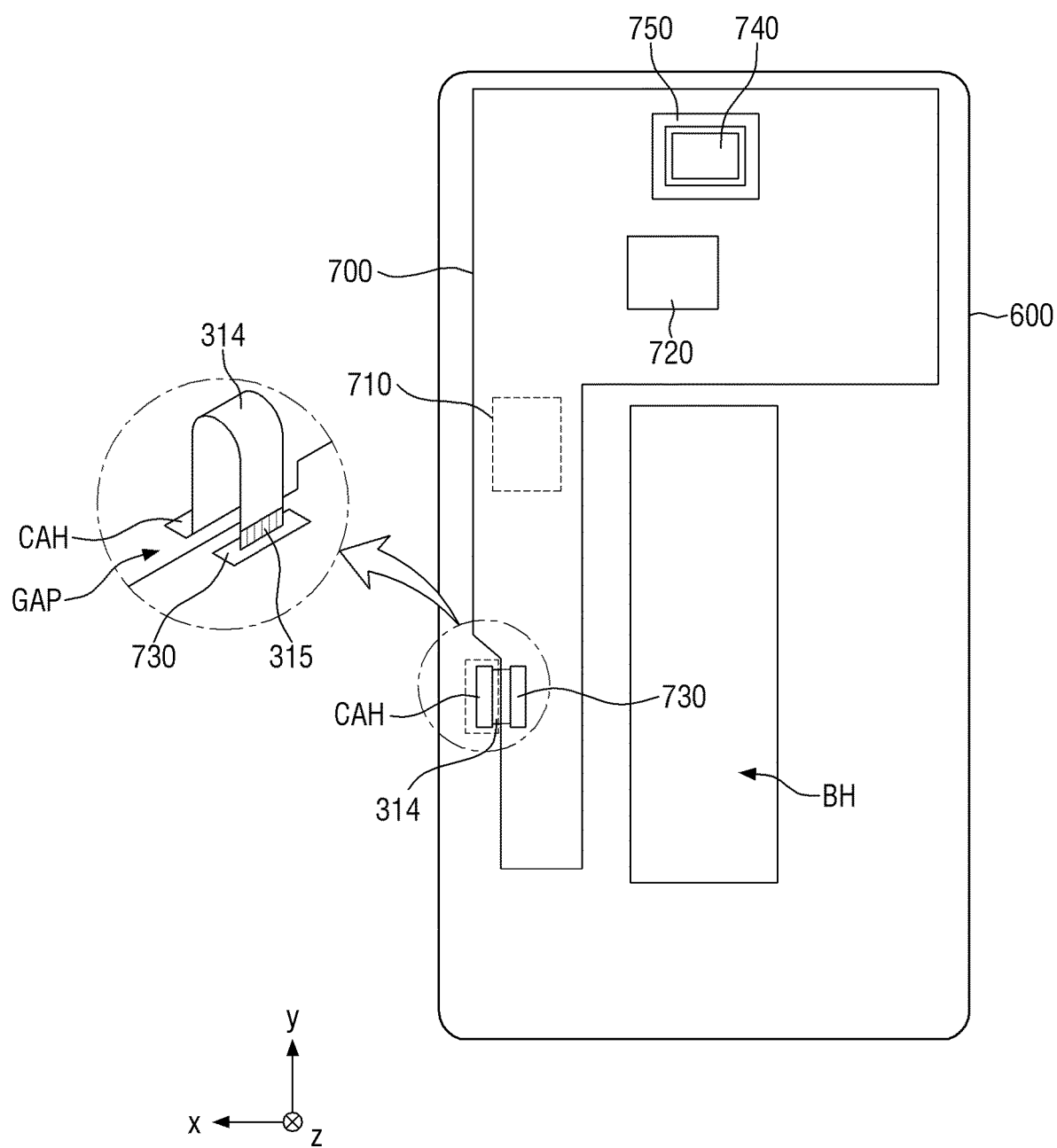
FIG. 5 is a bottom view of a middle frame and a main circuit board according to some exemplary embodiments.

FIG. 3 is a bottom view of a display panel attached a cover window according to some exemplary embodiments. FIG. 4 is a plan view of a middle frame according to some exemplary embodiments. FIG. 5 is a bottom view of a middle frame and a main circuit board according to some exemplary embodiments.

Hereinafter, referring to FIGS. 3 to 5, the connection between the display circuit board 310 and the third circuit board 550 and the connection between the second connection cable 314 and the main connector 730 of the main circuit board 700 will be described in more detail. It is to be noted that FIG. 4 is a plan view, whereas FIGS. 3 and 5 are bottom views, and, as such, the left and right of the display device 10 in FIG. 4 are reversed in FIGS. 3 and 5. For convenience of illustration, the display circuit board 310 is depicted with a dashed line in FIG. 4, and the second connection cable 314 is depicted in a circle with a dot-dash line in FIG. 5.

Referring to FIGS. 3 to 5, the display circuit board 310 may include a first circuit board 311, a second circuit board 312, and a first connection cable 313.

The first circuit board 311 may be attached to one side of the upper surface or the lower surface of the substrate of the display panel 300 and may be bent toward the lower surface of the substrate of the display panel 300. The first circuit board 311 may be fixed in the fixing holes FH formed in the middle frame 600 by fixing members as shown in FIG. 4.

The first circuit board 311 may include a display driver 320, a force sensing unit 330, a first connector 311*a*, a second connector 311*b*, and a third connector 311*c*. The display driver 320, the force sensing unit 330, the first connector 311*a*, the second connector 311*b*, and the third connector 311*c* may be disposed on the surface of the first circuit board 311.

The first connector 311*a* may be connected to one end of the first connection cable 313 connected to the second circuit board 312. The display driver 320 and the force sensing unit 330 mounted on the first circuit board 311 may be electrically connected to the second circuit board 312 via the first connection cable 313.

The second connector 311*b* may be connected to one end of the third circuit board 550 connected to the first force sensor 510 and the second force sensor 520. Accordingly, the first force sensor 510 and the second force sensor 520 may be electrically connected to the force sensing unit 330.

The third connector 311*c* may be connected to one end of the fourth circuit board 890 connected to the first vibration generator 810, the second vibration generator 820, the third vibration generator 830, and the fourth vibration generator 840. Accordingly, each of the first vibration generator 810, the second vibration generator 820, the third vibration generator 830, and the fourth vibration generator 840 may be electrically connected to the vibration driver 340 is of the display circuit board 310. Further, since the display circuit board 310 is electrically connected to the main circuit board 700 via the second connection cable 314, the first vibration generator 810, the second vibration generator 820, the third vibration generator 830, and the fourth vibration generator 840 may be electrically connected to the main processor 710 of the main circuit board 700.

The second circuit board 312 may include a touch connector 312a, a first connector 312b, and a second connector 312c. The first connector 312b and the second connector 312c may be disposed on one surface of the second circuit board 312, and the touch connector 312a may be disposed on the other surface of the second circuit board 312.

The touch connector 312a may be connected to one end of the touch circuit board 210. Accordingly, the touch driver 220 may be electrically connected to the second circuit board 312.

The first connector 312b may be connected to the other end of the first connection cable 313 connected to the first circuit board 311. The display driver 320 and the force sensing unit 330 mounted on the first circuit board 311 may be electrically connected to the second circuit board 312 via the first connection cable 313.

The second connector 312c may be connected to one end of a second connection cable 314 connected to the main connector 730 of the main circuit board 700. Thus, the second circuit board 312 may be electrically connected to the second circuit board 312 through the second connection cable 314.

A connecting portion 315 may be formed at the other end of the second connection cable 314. The connecting portion 315 of the second connection cable 314 may be extended to the lower surface of the middle frame 600 through the cable hole CAH of the middle is frame 600 as shown in FIGS. 4 and 5. In each of the first waterproof member 410 and the first force sensor 510, a depression NTH in the form of notch is formed in line with the cable hole CAH of the middle frame 600. Accordingly, the cable hole CAH of the middle frame 600 can be exposed without being covered by the first waterproof member 410 and the first force sensor 510.

As shown in FIG. 5, a gap GAP between the middle frame 600 and the main circuit board 700 is created in line with the cable hole CAH of the middle frame 600. Accordingly, the connecting portion 315 of the second connection cable 314, which has passed through the cable hole CAH, comes out through the gap GAP between the middle frame 600 and the main circuit board 700, to be extended to the lower surface of the main circuit board 700. In this manner, the connecting portion 315 of the second connection cable 314 may be connected to the main connector 730 disposed on the lower surface of the main circuit board 700.

As seen in FIGS. 3 to 5, a depression NTH in the form of notch is formed in the first waterproof member 410 and the first force sensor 510 so as not to cover the cable hole CAH of the middle frame 600. Accordingly, the second connection cable 314 connected to the display circuit board 310 may be extended to the rear surface of the middle frame 600 through the cable hole CAH and may be connected to the main connector 730 of the main circuit board 700. Thus, the display circuit board 310 can be stably connected to the main circuit board 700.

Figure 6:
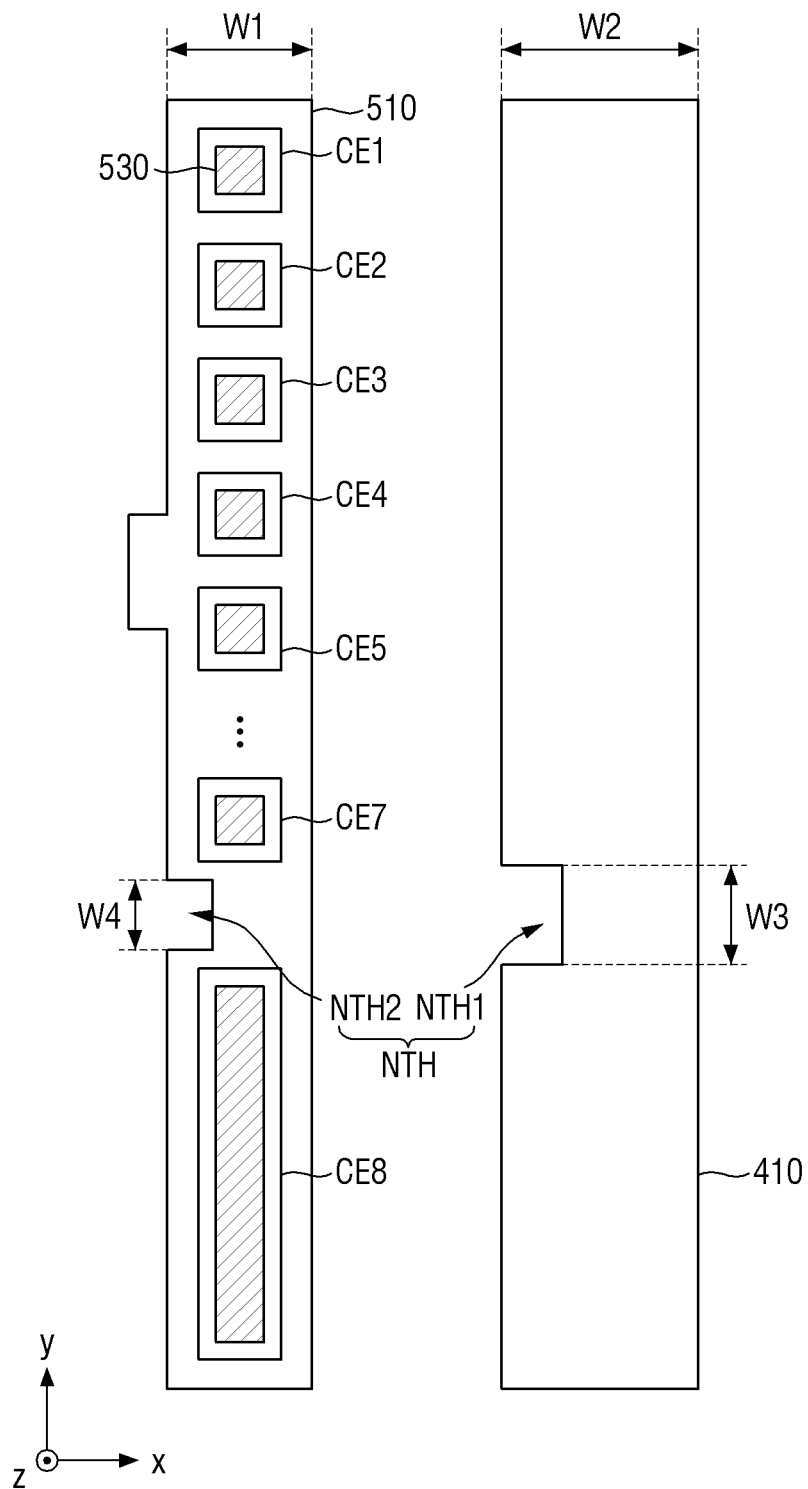
FIG. 6 is a plan view of a first force sensor, first bumps, and a first waterproof member according to some exemplary embodiments.
Figure 7:
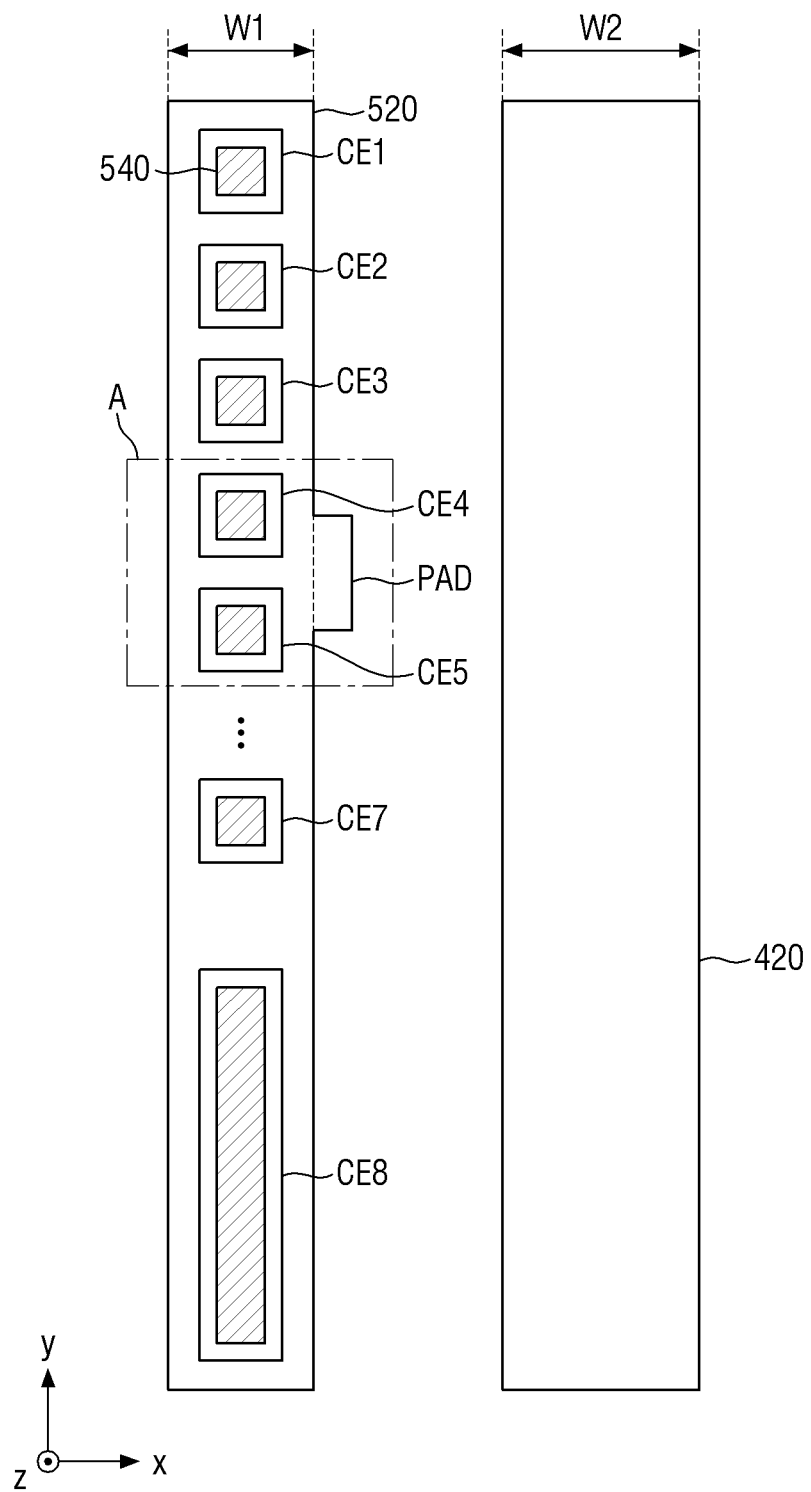
FIG. 7 is a plan view of a second force sensor, second bumps, and a first waterproof member according to some exemplary embodiments.

FIG. 6 is a plan view of a first force sensor, first bumps, and a first waterproof member according to some exemplary embodiments. FIG. 7 is a plan view of a second force sensor, second bumps, and a first waterproof member according to some exemplary embodiments.

Referring to FIG. 6, the first force sensor 510 may have a rectangular shape is having shorter sides in a first direction (x-axis direction) and longer sides in a second direction (y-axis direction) when viewed from the top, e.g., in a third direction (z-axis direction); however, exemplary embodiments are not limited thereto. The shape of the first force sensor 510 may vary depending on where it is disposed.

The first force sensor 510 includes a plurality of force detection cells CE1 to CE8. Although the first force sensor 510 shown in FIG. 6 includes eight force detection cells CE1 to CE8, the number of the force detection cells CE1 to CE8 is not limited to eight. Any suitable number of force detection cells may be utilized in association with exemplary embodiments.

Each of the force detection cells CE1 to CE8 may individually sense force at their respective positions. Although the force detection cells CE1 to CE8 shown in FIG. 6 are arranged in a single row, exemplary embodiments are not limited thereto. The force detection cells CE1 to CE8 may be arranged in several rows as desired or arranged in any other suitable manner. In addition, the force detection cells CE1 to CE8 may be arranged at predetermined intervals as shown in FIG. 6 or may be arranged continuously or variably.

Figure 15A:
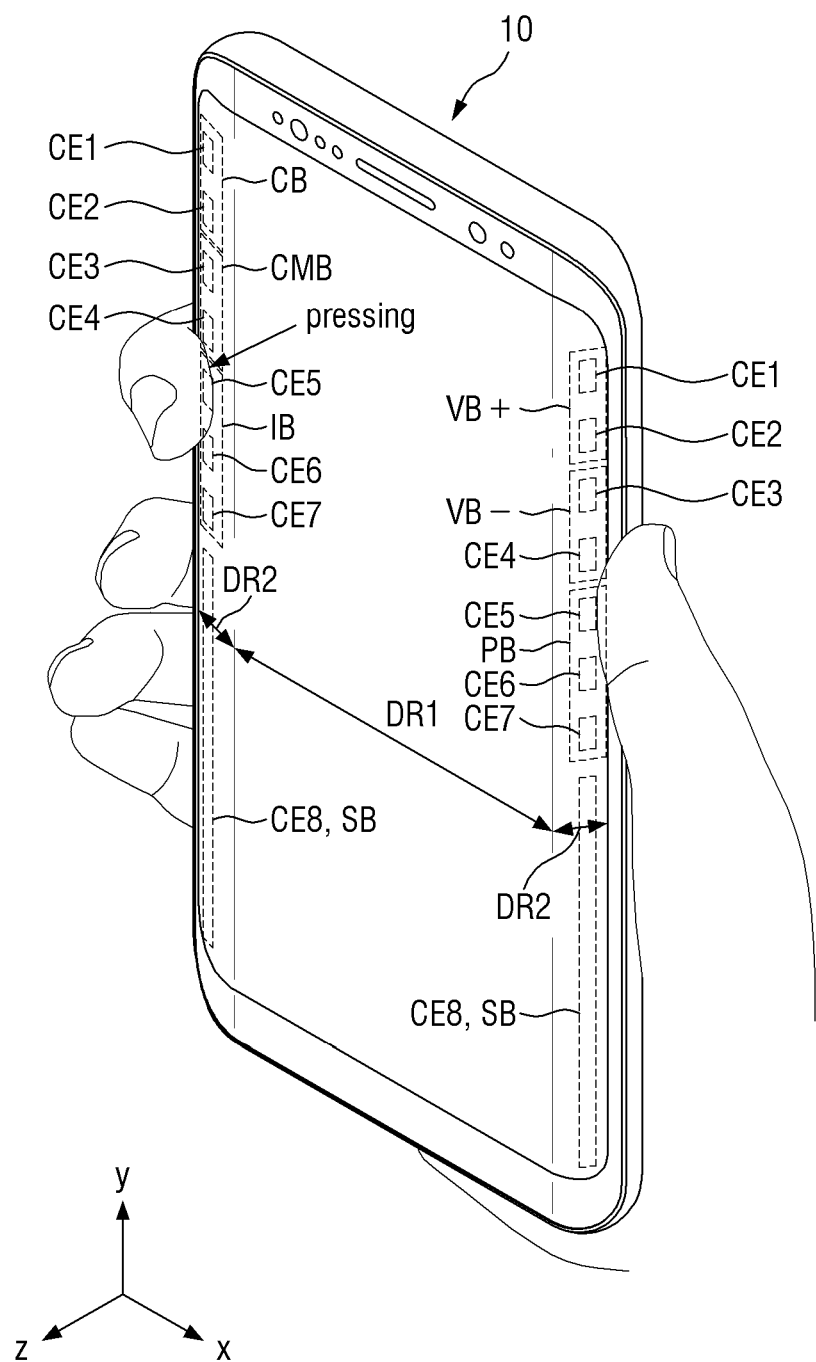
FIGS. 15A and 15B show examples of display devices utilizing force sensors as physical buttons in which vibration generators generate vibration only at a part of the display device in conjunction with the force sensors or a touch sensing device according to some exemplary embodiments.
Figure 15B:
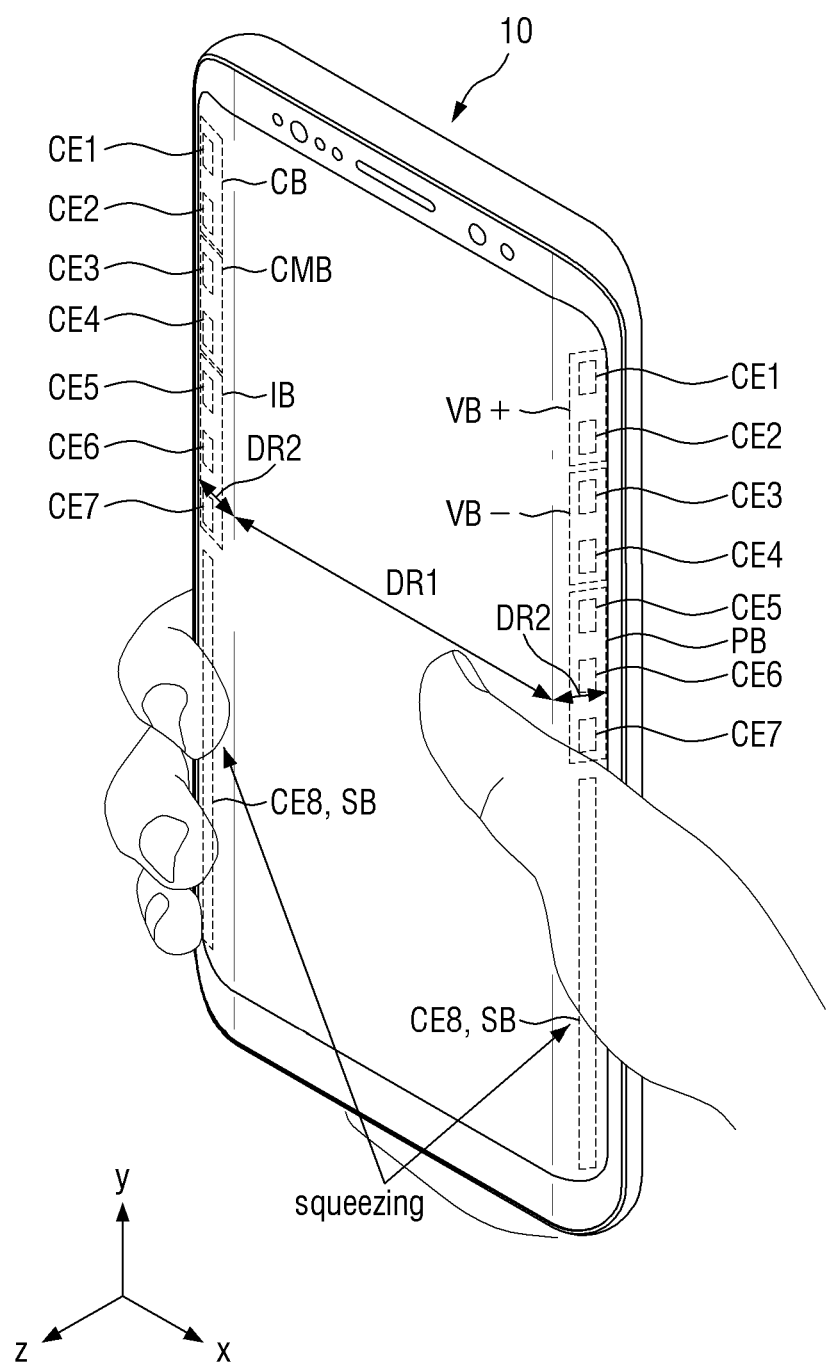

The force detection cells CE1 to CE8 may have different areas depending on the use. For example, as shown in FIG. 15A, the first to seventh force detection cells CE1 to CE7 may be used as physical buttons, such as volume control buttons VB+ and VB− and a power button PB disposed on a side of the display device 10. As another example, as shown in FIG. 15B, the eighth force detection cell CE8 may be used as a button SB for sensing a user's squeezing force. The eighth force detection cell CE8 may be formed to have a larger area than the first to seventh force detection cells CE1 to CE7. The eighth force detection cell CE8 may be longer than the first to seventh force detection cells CE1 to CE7 in the longitudinal direction (y-axis direction) of the first force sensor 510.

Additionally, although the first to seventh force detection cells CE1 to CE7 used as physical buttons have the same area in FIG. 6, exemplary embodiments are not limited thereto. For instance, the first to seventh force detection cells CE1 to CE7 may have different areas from one another. As another example, some of the first to seventh force detection cells CE1 to CE7 may have the same area, whereas others may have the same area, which is different from the area of the some of the force detection cells.

First bumps 530 may be disposed on the first to eighth force detection cells CE1 to CE8, respectively, such that the first bumps 530 overlap with the first to eighth force detection cells CE1 to CE8, respectively. The first bumps 530 may be used to press the first to eighth force detection cells CE1 to CE8 when a user's force is applied. Each of the first bumps 530 may be smaller than the respective one of the first to eighth force detection cells CE1 to CE8.

The area of each of the first bumps 530 may be proportional to the area of the respective one of the first to eighth force detection cells CE1 to CE8. For example, as shown in FIG. 6, when the area of the eighth force detection cell CE8 is larger than the area of each of the first to seventh force detection cells CE1 to CE7, the area of the first bump 530 on the eighth force detection cell CE8 may be larger than the area of the each of the first bumps 530 on the first to seventh force detection cells CE1 to CE7.

To prevent moisture or dust from permeating between the display panel 300 and the first force sensor 510, the first waterproof member 410 may be attached to the lower surface and one side surface of the first force sensor 510. As such, the width W2 of the first waterproof member 410 in the width direction (x-axis direction) may be larger than the width W1 of the first force sensor 510 in the width direction (x-axis direction). Accordingly, the area of the first waterproof member 410 may be larger than the area of the first force sensor 510.

In addition, in order not to cover the cable hole CAH of the middle frame 600, a first depression NTH1 in the form of notch may be formed in the first waterproof member 410 in line with the cable hole CAH of the middle frame 600, and a second depression NTH2 in the form of notch may be formed in the first force sensor 510. It is to be noted that the first depression NTH1 does not cover the second depression NTH2 taking into account the process error margin (e.g., manufacturing tolerances), and thus, the width W3 of the first depression NTH1 is larger than the width W4 of the second depression NTH2.

It is to be noted that the second force sensor 520, the second bumps 540, and the second waterproof member 420 shown in FIG. 7 are different from the first force sensor 510, the first bumps 530, and the first waterproof member 410 in that no depressions NTH are formed in the second force sensor 520 and the second waterproof member 420. It is noted, however, that the second force sensor 520 may include a pad area PAD, which is described in more detail in association with FIGS. 8 and 9. Therefore, the second force sensor 520, the second bump 540, and the second waterproof member 420 will not be described to avoid redundancy.

Figure 9:
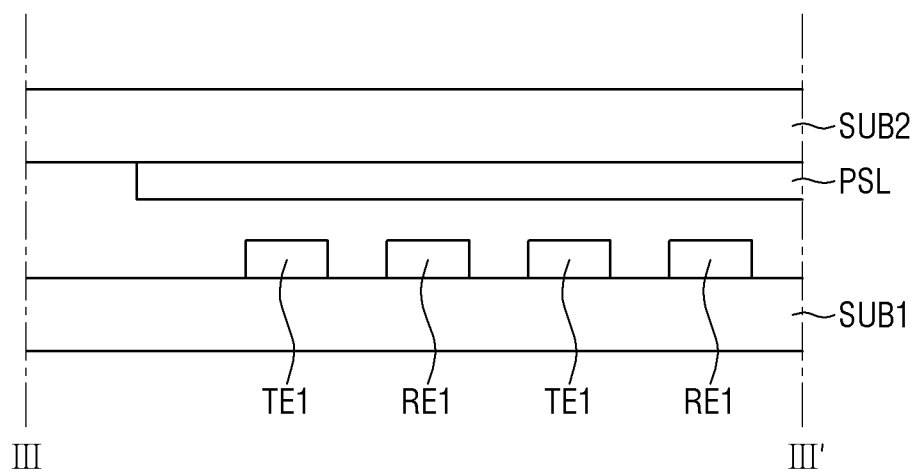
FIG. 9 is a cross-sectional view taken along sectional line III-III' of FIG. 8 according to some exemplary embodiments.
Figure 9:
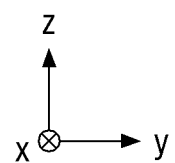

FIG. 8 is an enlarged, plan view of area A shown in FIG. 7 according to some exemplary embodiments. FIG. 9 is a cross-sectional view taken along sectional line III-III' of FIG. 8 according to some exemplary embodiments.

Referring to FIGS. 8 and 9, the first force sensor 510 includes a first substrate SUB1, a second substrate SUB2, a driving line TL, first to eighth sensing lines RL1 to RL8, a driving pad TP, first to eighth sensing pads RP1 to RP8, and first to eighth force detection cells CE1 to CE8, where p is an integer equal to or greater than two.

FIG. 8 shows only the fourth force detection cell CE4, the fifth force detection is cell CE5, and the pad area PAD for convenience of illustration. In FIG. 8, the second substrate SUB2 is not shown for convenience of illustration.

The first substrate SUB1 faces the second substrate SUB2. Each of the first substrate SUB1 and the second substrate SUB2 may include a material, such as polyethylene, polyimide, polycarbonate, polysulfone, polyacrylate, polystyrene, polyvinylchloride, polyvinyl alcohol, poly(nor-bornene), and polyester. According to some exemplary embodiments, each of the first substrate SUB1 and the second substrate SUB2 may be formed as a polyethylene terephthalate (PET) film or a polyimide film.

The first to eighth force detection cells CE1 to CE8 are disposed between the first substrate SUB1 and the second substrate SUB2. The driving line TL, the first to eighth sensing lines RL1 to RL8, the driving pad TP, and the first to eighth sensing pads RP1 to RP8 are disposed on one surface of the first substrate SUB1 facing the second substrate SUB2. The first to eighth force detection cells CE1 to CE8 are disposed between the first substrate SUB1 and the second substrate SUB2.

Each of the first to eighth force detection cells CE1 to CE8 may be connected to at least one driving line (e.g., driving line TL) and at least one sensing line (e.g., at least one of first to eighth sensing lines RL1 to RL8). For example, although the first to eighth force detection cells CE1 to CE8 may be commonly connected to a single driving line TL, they may be connected to the first to eighth sensing lines RL1 to RL8, respectively. As shown in FIG. 8, the fourth force detection cell CE4 may be connected to the driving line TL and the fourth sensing line RL4, whereas the fifth force detection cell CE5 may be connected to the driving line TL and the fifth sensing line RL5.

The driving line TL may be connected to the driving pad TP, and the first to is eighth sensing lines RL1 to RL8 may be connected to the first to eighth sensing pads RP1 to RP8, respectively. The first sensing line RL1 may be connected to the first sensing pad RP1, the second sensing line RL2 may be connected to the second sensing pad RP2, the third sensing line RL3 may be connected to the third sensing pad RP3, and the fourth sensing line RL4 may be connected to the fourth sensing pad RP4. The fifth sensing line RL5 may be connected to the fifth sensing pad RP5, the sixth sensing line RL6 may be connected to the sixth sensing pad RP6, the seventh sensing line RL7 may be connected to the seventh sensing pad RP7, and the eighth sensing line RL8 may be connected to the eighth sensing pad RP8.

The pad area PAD may protrude from one side of the first substrate SUB1. The side of the first substrate SUB1 may be the longer side of the first force sensor 510. Although the pad area PAD protrudes from the center of the longer side of the first substrate SUB1 in FIG. 8, exemplary embodiments are not limited thereto. For instance, the pad area PAD may protrude from one end or the other end of the longer side of the first substrate SUB1.

The driving pad TP and the first to eighth sensing pads RP1 to RP8 may be disposed in (or on) the pad area PAD. The driving pad TP and the first to eighth sensing pads RP1 to RP8 may be connected to a driving lead line TL_F and first to eighth sensing lead lines RL1_F to RL8_F of the third circuit board 550, respectively, through an anisotropic conductive film. The driving pad TP may be connected to the driving lead line TL_F, the first sensing pad RP1 may be connected to a first sensing lead line RL1_F, the second sensing pad RP2 may be connected to a second sensing lead line RL2_F, the third sensing pad RP3 may be connected to a third sensing lead line RL3_F, and the fourth sensing pad RP4 may be connected to a fourth sensing lead line RL4_F. In addition, the fifth sensing pad RP5 may be connected to the fifth sensing lead line RP5_F, the sixth sensing pad RP6 may be connected to the sixth sensing lead is line RP6_F, the seventh sensing pad RP7 may be connected to the seventh sensing lead line RP7_F, and the eighth sensing pad RP8 may be connected to the eighth sensing lead line RP8_F.

As shown in FIGS. 3 and 8, the third circuit board 550 is connected to the display circuit board 310 so that the third circuit board 550 may be electrically connected to the force sensing unit 330 mounted on the display circuit board 310. The force sensing unit 330 applies a driving voltage to the driving line TL through the driving lead line TL_F of the third circuit board 550 and the driving pad TP of the first force sensor 510, and senses the current values or voltage values from the first to eighth sensing lines RL1 to RL8 through the first to eighth sensing lead lines RL1_F to RL8_F connected to the first to eighth sensing pads RP1 to RP8 of the first force sensor 510, to thereby sense force applied to the first to eighth force detection cells CE1 to CE8.

The first force sensor 510 may further include a coupling layer (not shown) disposed between the first substrate SUB1 and the second substrate SUB2 to couple the first substrate SUB1 and the second substrate SUB2 together. The coupling layer may be implemented as a pressure-sensitive adhesive layer or an adhesive layer. The coupling layer may be disposed along the periphery of the first substrate SUB1 and the second substrate SUB2. In some exemplary embodiments, the coupling layer may completely surround the edges of the first substrate SUB1 and the second substrate SUB2 to seal the inside of the first force sensor 510. In addition, the coupling layer may serve as a spacer for maintaining a distance between the first substrate SUB1 and the second substrate SUB2. The coupling layer may not overlap with the driving line TL, the first to eighth sensing lines RL1 to RL8, the first to eighth force detection cells CE1 to CE8, the driving pad TP, or the first to eighth sensing pads RP1 to RP8.

The coupling layer may be first attached to one surface of one of the first is substrate SUB1 and the second substrate SUB2 and then attached to one surface of the other substrate during a process of attaching the first substrate SUB1 and the second substrate SUB2 together. As another example, a coupling layer may be disposed on each of one surface of the first substrate SUB1 and one surface of the second substrate SUB2, and then the coupling layer on the first substrate SUB1 may be attached to the coupling layer on the second substrate SUB2 during a process of attaching the first substrate SUB1 and the second substrate SUB2 together.

As can be appreciated from FIGS. 6, 8, and 9, each of the first to eighth force detection cells CE1 to CE8 includes a driving connection electrode TCE, a sensing connection electrode RCE, driving electrodes TE1, sensing electrodes RE1, and a force sensing layer PSL.

The driving connection electrode TCE, the sensing connection electrode RCE, the driving electrodes TE1, and the sensing electrodes RE1 are disposed on the first substrate SUB1 facing the second substrate SUB2.

The driving connection electrode TCE is connected to the driving line TL and the driving electrode TEl For instance, the driving connection electrode TCE is connected to the driving line TL at one end in the longitudinal direction (y-axis direction). The driving electrodes TE1 may branch off in the width direction (x-axis direction) of the driving connection electrode TCE.

The sensing connection electrode RCE is connected to one of the first to eighth sensing lines RL1 to RL8 and the sensing electrodes RE1. For instance, the sensing connection electrode RCE is connected to one of the first to eighth sensing lines RL1 to RL8 at one end in the longitudinal direction (y-axis direction). The sensing electrodes RE1 may branch off in the width direction (x-axis direction) of the sensing connection electrode RCE.

The driving electrodes TE1 and the sensing electrodes RE1 may be disposed on is the same layer. The driving electrodes TE1 and the sensing electrodes RE1 may be made of the same material. For example, the driving electrodes TE1 and the sensing electrodes RE1 may include a conductive material, such as silver (Ag) and copper (Cu); however, exemplary embodiments are not limited thereto. The driving electrodes TE1 and the sensing electrodes RE1 may be formed on the first substrate SUB1 by screen printing.

The driving electrodes TE1 and the sensing electrodes RE1 are disposed adjacent to each other, but are not connected to each other. The driving electrodes TE1 and the sensing electrodes RE1 may be arranged in parallel with one another. The driving electrodes TE1 and the sensing electrodes RE1 may be alternately arranged in the longitudinal direction (y-axis direction) of the driving connection electrode TCE and the sensing connection electrode RCE. That is to say, the driving electrode TE1, the sensing electrode RE1, the driving electrode TE1, and the sensing electrode RE1 may be arranged repeatedly in this order in the longitudinal direction (y-axis direction) of the driving connection electrode TCE and the sensing connection electrode RCE.

The force sensing layer PSL is disposed on the surface of the second substrate SUB2 facing the first substrate SUB1. The force sensing layer PSL may be disposed such that the force sensing layer PSL overlaps with the driving electrodes TE1 and the sensing electrodes RE1. The force sensing layer PSL may include a pressure sensitive material and a polymer resin where the pressure sensitive material is disposed. The pressure sensitive material may be metal micro-particles (or metal nanoparticles), such as nickel, aluminum, titanium, tin and copper; however, exemplary embodiments are not limited thereto. For example, the force sensing layer PSL may be a quantum tunneling composite (QTC).

When no force in the height (or thickness) direction (z-axis direction) of the first is force sensor 510 is applied to the second substrate SUB2, there is a gap between the force sensing layer PSL and the driving electrode TE1 and between the force sensing layer PSL and the sensing electrodes RE1 as shown in FIG. 9. That is to say, when no force is applied to the second substrate SUB2, the force sensing layer PSL is spaced apart from the driving electrodes TE1 and the sensing electrodes RE1.

When a force is applied to the second substrate SUB2 in the height direction (z-axis direction) of the first force sensor 510, the force sensing layer PSL may come in contact with the driving electrodes TE1 and the sensing electrodes RE1. In this case, at least one of the driving electrodes TE1 and at least one of the sensing electrodes RE1 may be physically connected through the force sensing layer PSL, and the force sensing layer PSL may work as an electrical resistance.

According to some exemplary embodiments, the area in which the force sensing layer PSL comes in contact with the driving electrodes TE1 and with the sensing electrodes RE1 depends on the force applied to the first force sensor 510, such that the resistance value of the sensing line electrically connected to the sensing electrodes RE1 may vary. The force sensing unit 330 senses a change in current value or a voltage value from the first to eighth sensing lines RL1 to RL8, thereby sensing the applied force, e.g., a force that the user presses by hand.

The second force sensor 520 is substantially identical to the first force sensor 510 shown in FIGS. 8 and 9, and, therefore, a redundant description will be omitted.

Figure 10:
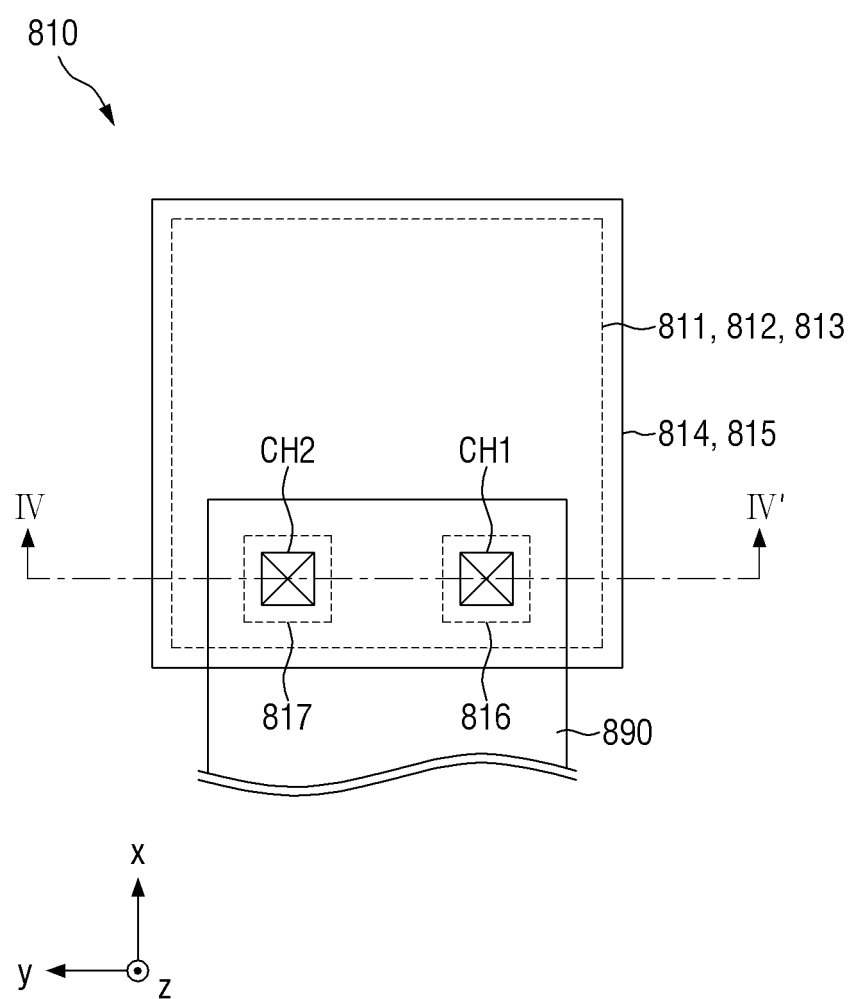
FIG. 10 is a plan view showing a first vibration generator according to some exemplary embodiments.
Figure 11:
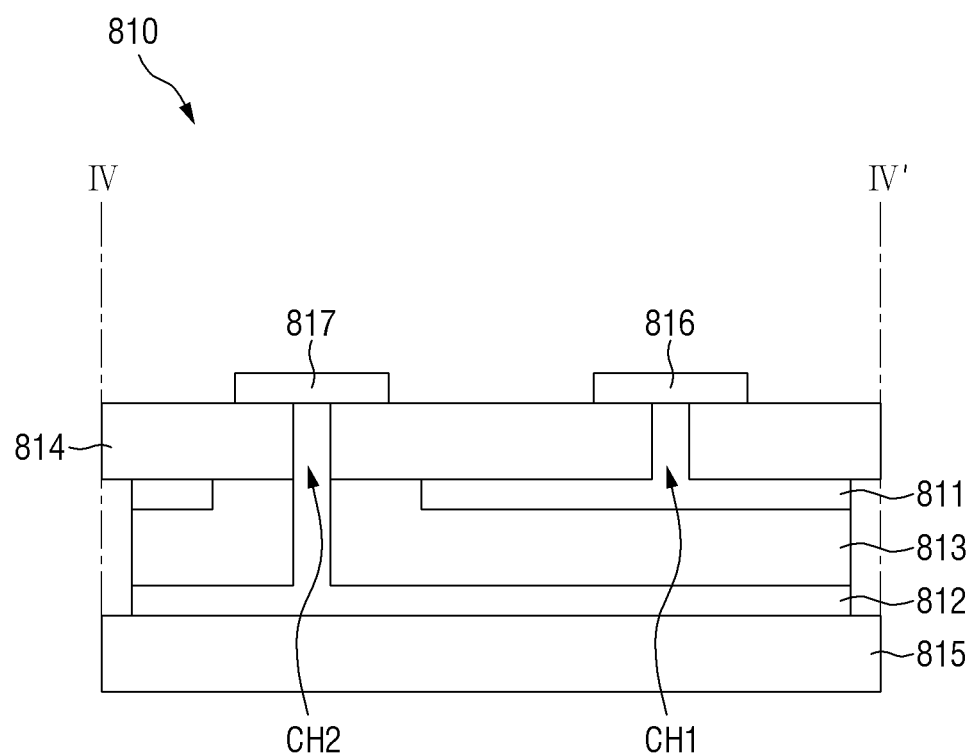
FIG. 11 is a cross-sectional view taken along sectional line IV-IV' of FIG. 10 according to some exemplary embodiments.

FIG. 10 is a plan view showing a first vibration generator according to some exemplary embodiments. FIG. 11 is a cross-sectional view taken along sectional line IV-IV' of FIG. 10 according to some exemplary embodiments.

Referring to FIGS. 10 and 11, the first vibration generator 810 may include a first is electrode 811, a second electrode 812, a vibration layer 813, a first base substrate 814, a second base substrate 815, a first pad electrode 816, and a second pad electrode 817.

The first electrode 811 may be disposed on the first surface of the first base substrate 814, and the vibration layer 813 may be disposed on the first electrode 811. The second electrode 812 may be disposed on the vibration layer 813, and the second base substrate 815 may be disposed on the second electrode 812. The first pad electrode 816 and the second pad electrode 817 may be disposed on the second surface of the first base substrate 814.

The first electrode 811 and the second electrode 812 may be made of a conductive material. For example, the conductive material may be a transparent conductive material, such as indium tin oxide (ITO), indium zinc oxide (IZO), etc., an opaque metal material, a conductive polymer, a carbon nanotube (CNT), etc.

The first electrode 811 may be connected to the first pad electrode 816 through a first contact hole CH1 penetrating the first base substrate 814, and accordingly may be connected to the fourth circuit board 890 through the first pad electrode 816. In addition, the second electrode 812 may be connected to the second pad electrode 817 through a second contact hole CH2 penetrating the vibration layer 813 and the first base substrate 814, and accordingly may be connected to the fourth circuit board 890 through the second pad electrode 817. As a result, the first electrode 811 and the second electrode 812 can be electrically connected to the vibration driver 340 of the display circuit board 310 through the fourth circuit board 890, thereby receiving the first driving voltage and the second driving voltage from the vibration driver 340.

Figure 12:
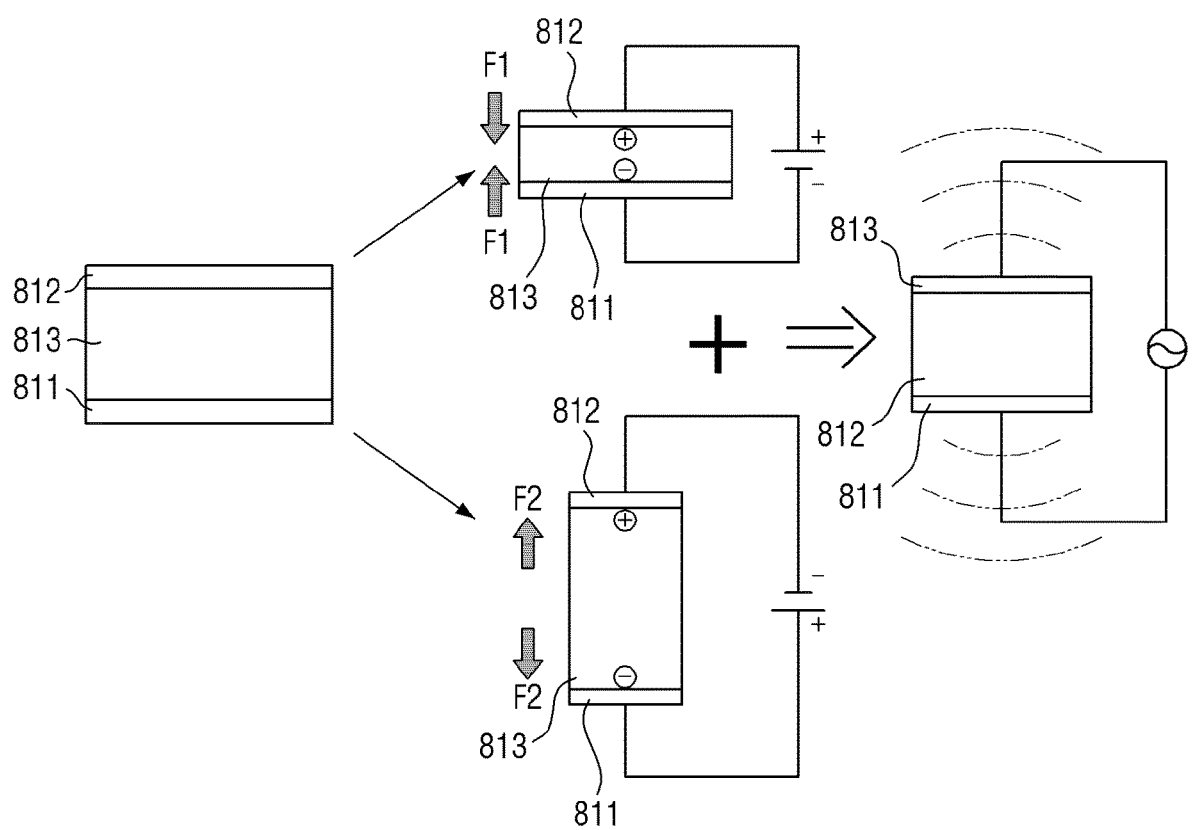
FIG. 12 is a view for illustrating an example of vibration of the first vibration generator of FIG. 10 according to some exemplary embodiments.

FIG. 12 is a view for illustrating an example of vibration of the first vibration generator of FIG. 10 according to some exemplary embodiments.

The vibration layer 813 may be a piezo actuator that is deformed as shown in FIG. 12 according to the difference between the voltage applied to the first electrode 811 and the voltage applied to the second electrode 812. In this case, the vibration layer 813 may be at least one of a piezoelectric material, such as a poly vinylidene fluoride (PVDF) film, a plumbum zirconate titanate (PZT), etc., and an electroactive polymer.

In this case, the vibration layer 813 contracts according to a first force F1 or relaxes according to a second force F2 according to the difference between the first driving voltage applied to the first electrode 811 and the second driving voltage applied to the second electrode 812. For instance, as shown in FIG. 12, when the vibration layer 813 adjacent to the first electrode 811 has a positive polarity characteristic and the vibration layer 813 adjacent to the second electrode 812 has a negative polarity characteristic, the positive first driving voltage is applied to the first electrode 811 and the negative second driving voltage is applied to the second electrode 812, such that the vibration layer 813 may contract according to the first force F1. In addition, when the vibration layer 813 adjacent to the first electrode 811 has a positive polarity characteristic and the vibration layer 813 adjacent to the second electrode 812 has a negative polarity characteristic, the negative first driving voltage is applied to the first electrode 811 and the positive second driving voltage is applied to the second electrode 812, such that the vibration layer 813 may relax according to the second force F2. When the first driving voltage applied to the first electrode 811 and the second driving voltage applied to the second electrode 812 have alternately repeated positive and negative polarities, the vibration layer 813 repeatedly contracts and relaxes. As a result, the first vibration generator 810 vibrates.

In addition, the first vibration generator 810 may also vibrate the display panel 300 to output a first sound. In this case, since the display device 10 can output sound by the a sound generator not exposed to the outside, the sound generator disposed on the front surface of is the display device 10 can be eliminated. As a result, the transmissive portion DA100 can be widened. That is to say, the display area of the display device 10 can be widened or enlarged.

The first base substrate 814 and the second base substrate 815 may be made of an insulating material. For example, each of the first base substrate 814 and the second base substrate 815 may be polyethersulfone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or any suitable combination thereof. For example, each of the first base substrate 814 and the second base substrate 815 may be made of a plastic material.

The first pad electrode 816 and the second pad electrode 817 may be made of a conductive material. The first pad electrode 816 and the second pad electrode 817 may be connected to the fourth circuit board 890 using an anisotropic conductive film.

Each of the second vibration generator 820, the third vibration generator 830, and the fourth vibration generator 840 is substantially identical to the first vibration generator 810 described above with reference to FIGS. 10 to 12, and, therefore, a redundant description will be omitted.

As can be appreciated from FIGS. 10 to 12, the first vibration generator 810, the second vibration generator 820, the third vibration generator 830, and the fourth vibration generator 840 may be attached to the upper surface of the middle frame 600 disposed under the display panel 300, and connected to the display circuit board 310 through the fourth circuit board 890. By doing so, the first vibration generator 810, the second vibration generator 820, the third vibration generator 830, the fourth vibration generator 840, the fourth circuit board 890, and the is middle frame 600 may be implemented as a single module together with the display panel 300.

FIG. 13 is a cross-sectional view taken along sectional lines of I-I' and II-II' of FIGS. 3 and 4 according to some exemplary embodiments.

Referring to FIG. 13, the first force sensor 510 may be disposed in the second area DR2 corresponding to a curved portion of the display device 10. The first bumps 530 may be disposed on the upper surface of the first force sensor 510. Each of the first bumps 530 may be attached to the lower surface of the panel support member 390 under the display panel 300 through the fourth adhesive member 940. Exemplary embodiments, however, are not limited thereto. For example, each of the first bumps 530 may be disposed on the lower surface of the first force sensor 510. Then, the upper surface of the first force sensor 510 may be attached to the lower surface of the panel support member 390 under the display panel 300 through the fourth adhesive member 940. Exemplary embodiments, however, are not limited thereto. For example, each of the first bumps 530 may be disposed on the lower surface of the first force sensor 510. The upper surface of the first force sensor 510 may be attached to the lower surface of the panel support member 390 under the display panel 300 through the fourth adhesive member 940. The fourth adhesive member 940 may be an optically cleared adhesive film (OCA) or an optically cleared resin (OCR).

The first waterproof member 410 may be disposed on the lower surface of the first force sensor 510. For instance, the first waterproof member 410 may be attached to the lower surface of the first force sensor 510 and the upper surface of the middle frame 600.

In addition, the first waterproof member 410 may be additionally attached to a side surface of the first force sensor 510 so as to prevent moisture or dust from permeating between the display panel 300 and the first force sensor 510. For instance, as shown in FIG. 13, is the upper surface of the first waterproof member 410 attached to one side surface of the first force sensor 510 and may be attached to the lower surface of the panel support member 390 of the display panel 300. In this case, the fourth adhesive member 940 may be eliminated. Since the first force sensor 510 is disposed at (or near) the right edge of the display panel 300, one side surface of the first force sensor 510 may be the right side surface of the first force sensor 510.

As seen in FIG. 13, the first waterproof member 410 is attached to the lower surface and the right side surface of the first force sensor 510. Accordingly, even if the first force sensor 510 is disposed at the right edge on the lower surface of the panel support member 390, it is possible to prevent moisture and dust from permeating between the display panel 300 and the middle frame 600 by the first waterproof member 410. That is to say, the display device 10 with waterproof and dustproof capabilities can be produced.

The first vibration generator 810 may be disposed in the first area DR1 corresponding to the flat portion of the display device 10. The first vibration generator 810 may be disposed adjacent to the first force sensor 510.

The first vibration generator 810 may be attached to the upper surface of the middle frame 600 through the fifth adhesive member 950. The fifth adhesive member 950 may be an optically cleared adhesive film (OCA) or an optically cleared resin (OCR).

The fourth circuit board 890 may be attached to the first vibration generator 810. The fourth circuit board 890 may be attached to the first pad electrode 816 and the second pad electrode 817 disposed on the upper surface of the first vibration generator 810.

The first electromagnetic wave shielding member 450 may be disposed to surround the side surfaces of the first vibration generator 810. The first electromagnetic wave shielding member 450 shown in FIG. 4 surrounds all the side surfaces of the first vibration is generator 810, but exemplary embodiments are not limited thereto. For instance, when the first vibration generator 810 is disposed at a corner of the middle frame 600, the first electromagnetic wave shielding member 450 may be disposed to surround two side surfaces of the first vibration generator 810. In addition, when the first vibration generator 810 is disposed at the edge of left side, upper side, or lower side of the middle frame 600, the first electromagnetic wave shielding member 450 may be disposed to surround three side surfaces of the first vibration generator 810.

The first electromagnetic wave shielding member 450 may be formed of a waterproof member (or material) substantially identical to the first waterproof member 410. For instance, the first electromagnetic wave shielding member 450 may include a base film, a first adhesive layer disposed on a surface of the base film, and a second adhesive layer disposed on the other surface of the base film. The base film may be a polyethylene terephthalate (PET), a polyethylene terephthalate (PET), and a cushion layer, or a polyethylene foam (PE-foam). The first adhesive film and the second adhesive film may be pressure sensitive adhesive (PSA).

To prevent (e.g., effectively prevent) vibration generated by the first vibration generator 810 from propagating to its surroundings, the first electromagnetic wave shielding member 450 may be higher (extender further from the middle frame 600) than the first vibration generator 810. Accordingly, the first electromagnetic wave shielding member 450 may be attached to the lower surface of the panel support member 390 of the display panel 300 and the upper surface of the middle frame 600. When the fourth circuit board 890 is disposed on one side of the first vibration generator 810, the first electromagnetic wave shielding member 450 may be attached to the lower surface of the panel support member 390 and the fourth circuit board 890. As seen in FIG. 13, the upper surface, the lower surface, and the side surfaces of the first vibration generator 810 are surrounded by the panel support member 390 of the display is panel 300, the middle frame 600, and the first electromagnetic wave shielding member 450. As such, it is possible to prevent vibration generated by the first vibration generator 810 from propagating to the surroundings by the first electromagnetic wave shielding member 450.

Figure 14A:
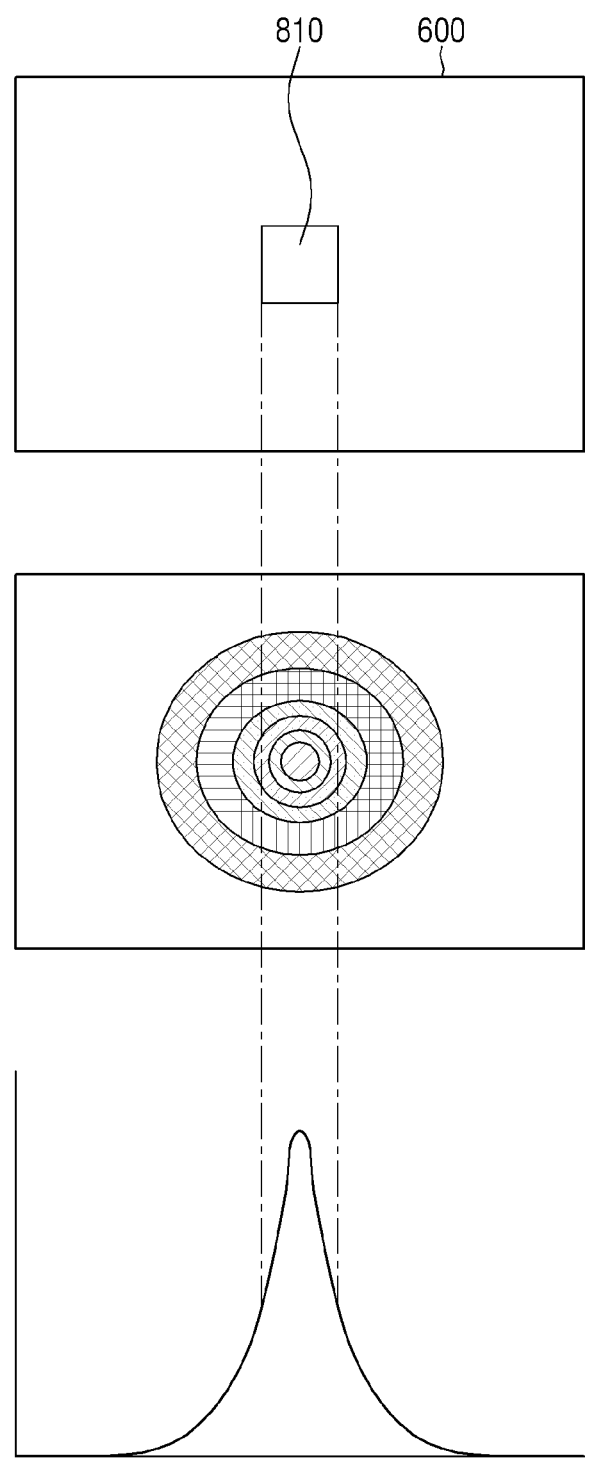
FIG. 14A shows a vibration measurement image and a graph showing vibration of a vibration generator when there is no electromagnetic wave shielding member.
Figure 14B:
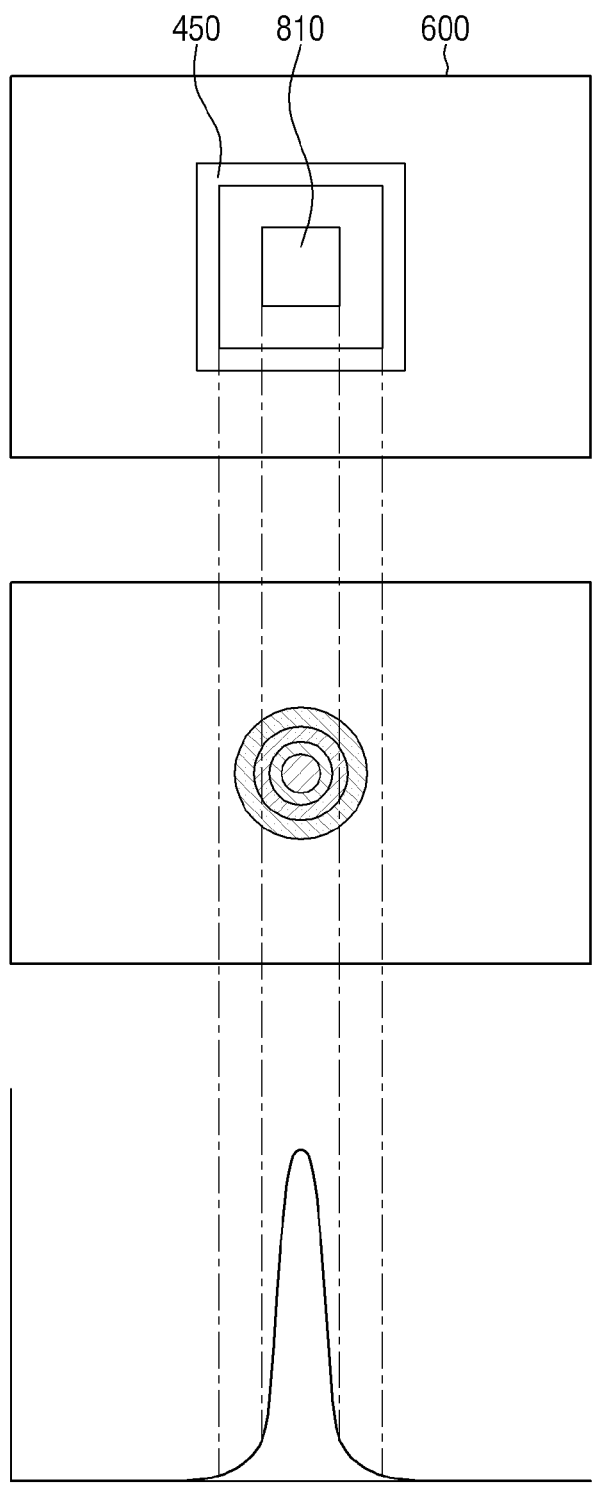
FIG. 14B shows a vibration measurement image and a graph showing vibration of a vibration generator when there is an electromagnetic wave shielding member according to some exemplary embodiments.

FIG. 14A shows a vibration measurement image and a graph showing vibration of the vibration generator when there is no electromagnetic wave shielding member. FIG. 14B shows a vibration measurement image and a graph showing vibration of the vibration generator when there is an electromagnetic wave shielding member according to some exemplary embodiments.

In the images of FIGS. 14A and 14B, the x-axis represents the position of the first vibration generator 810 in the lateral direction, and the y-axis represents the position of the first vibration generator 810 in the vertical direction. The vibration displacement becomes lower in order of the various cross-hatched sections. In the graphs of FIGS. 14A and 14B, the x-axis represents the position of the first vibration generator 810 in the lateral direction, and the y-axis also represents the vibration displacement.

When there is no first electromagnetic wave shielding member 450 as shown in FIG. 14A, the vibration generated by the first vibration generator 810 propagates to the surroundings. In contrast, when there is the first electromagnetic wave shielding member 450 as shown in FIG. 14B, the vibration generated by the first vibration generator 810 cannot pass the first electromagnetic wave shielding member 450. As a result, the vibration generated by the first vibration generator 810 is limited within the area surrounded by the first electromagnetic wave shielding member 450. In other words, the vibration generated by the first vibration generator 810 can be blocked by the first electromagnetic wave shielding member 450.

As described in association with FIGS. 13 and 14B, the vibration by the first is vibration generator 810 is blocked by the first electromagnetic wave shielding member 450. In this manner, when the first vibration generator 810 vibrates, a user can feel the vibration only at the position where the first vibration generator 810 is disposed.

The cross-sectional view taken along line II-II' of FIG. 4 is substantially identical to the cross-sectional view shown in FIG. 13 taken along line I-I' of FIG. 4, except that the second waterproof member 420, the second bump 540, the second force sensor 520, the second vibration generator 820, the second electromagnetic wave shielding member 460, and the fourth circuit board 890 are disposed at the left edge (or side portion) of the lower surface of the panel support member 390 of the display panel 300. Therefore, the cross-sectional view taken along line II-II' will not be described to avoid redundancy.

In addition, the cross-sectional view of each of the third vibration generator 830, the third electromagnetic wave shielding member 470, the fourth vibration generator 840, and the fourth electromagnetic wave shielding member 480 may be substantially identical to the first vibration generator 810 and the second vibration generator 820 shown in FIG. 13. Therefore, the third vibration generator 830, the third electromagnetic wave shielding member 470, the fourth vibration generator 840, and the fourth electromagnetic wave shielding member 480 will not be described to avoid redundancy.

FIGS. 15A and 15B show examples of display devices utilizing force sensors as physical buttons in which vibration generators generate vibration only at a part of the display device in conjunction with the force sensors or a touch sensing device according to some exemplary embodiments.

FIGS. 15A and 15B show the first to eighth force detection cells CE1 to CE8 of each of the first force sensor 510 and the second force sensor 520 disposed in the second areas DR2 of the display device 10. The first vibration generator 810 may be disposed adjacent to the first to fourth force detection cells CE1, CE2, CE3, and CE4 of the first force sensor 510 disposed on the right curved portion of the display device 10. The third vibration generator 830 may be disposed adjacent to the fifth to eighth force detection cells CE5, CE6, CE7, and CE8. In addition, the second vibration generator 820 may be disposed adjacent to the first to fourth force detection cells CE1, CE2, CE3, and CE4 of the second force sensor 520 disposed on the left curved portion of the display device 10. The fourth vibration generator 840 may be disposed adjacent to the fifth to eighth force detection cells CE5, CE6, CE7, and CE8.

FIG. 15A shows that a user holds the display device 10 by hand and presses the fifth force detection cell CE5 on the left curved portion corresponding to the second area DR2 of the display device 10 with the index finger. FIG. 15B shows that a user holds the display device 10 by hand and squeezes the eighth force detection cell CE8 on the left curved portion corresponding to the second area DR2 of the display device 10 with the middle finger, the ring finger, and the little finger while squeezing the eighth force detection cell CE8 on the right curved portion corresponding to the second area DR2 of the display device 10 with the palm of the hand.

Referring to FIGS. 15A and 15B, the first force sensor 510 and the second force sensor 520 may be utilized on behalf of physical buttons for the display device 10. For instance, when a force is applied to one or more of the first to eighth force detection cells CE1 to CE8 of the first force sensor 510 on the right curved portion of the display device 10 and/or to one or more of the first to eighth force detection cells CE1 to CE8 of the second force sensor 520 on the left curved portion of the display device 10, a predetermined application or operation can be performed.

In addition, when a force is applied to the first force sensor 510, the first vibration generator 810 or the third vibration generator 830 adjacent to the first force sensor 510 may vibrate. When a force is applied to the second force sensor 520, the second vibration generator 820 or the fourth vibration generator 840 adjacent to the second force sensor 520 may vibrate. In some exemplary embodiments, the vibration generator closest to the user's touch position may vibrate.

For example, among the first to eighth force detection cells CE1 to CE8 of the first force sensor 510 on the right curved portion of the display device 10, the first force detection cell CE1 and the second force detection cell CE2 may be utilized as volume-up buttons VB+ that the user presses to turn up the volume of the display device 10. The third force detection cell CE3 and the fourth force detection cell CE4 may be utilized as volume-down buttons VB- that the user presses to turn down the volume of the display device 10. The fifth force detection cell CE5, the sixth force detection cell CE6, and the seventh force detection cell CE7 may be utilized as power buttons PWB that the user presses to turn off the power.

When a force is sensed from the first force detection cell CE1 and the second force detection cell CE2 on the right curved portion of the display device 10, the main processor 710 may control a speaker of the display device 10 so that the volume is turned up. In addition, when a force is sensed from the third force detection cell CE3 and the fourth force detection cell CE4 on the right curved portion of the display device 10, the main processor 710 may control the speaker of the display device 10 so that the volume is turned down. In this case, the main processor 710 may output vibration data to the first vibration generator 810 adjacent to the first to fourth force detection cells CE1, CE2, CE3, and CE4 on the right curved portion of the display device 10 so that the first vibration generator 810 vibrates. As another example, the main is processor 710 may output the vibration data to the first vibration generator 810 closest to the position of the user's touch so that the first vibration generator 810 vibrates in response to the touch data input from the touch driver 220.

In addition, when a force is sensed from the fifth force detection cell CE5 and the sixth force detection cell CE6, and the seventh force detection cell CE7 on the right curved portion of the display device 10, the main processor 710 may control the display device 10 so that the screen is turned off or the screen is turned on and a user can select to power off/on the display device 10. In this case, the main processor 710 may output vibration data to the third vibration generator 830 adjacent to the fifth to seventh force detection cells CE5, CE6, and CE7 on the right curved portion of the display device 10 so that the third vibration generator 830 vibrates. As another example, the main processor 710 may output the vibration data to the third vibration generator 830 closest to the position of the user's touch so that the third vibration generator 830 vibrates in response to the touch data input from the touch driver 220.

In addition, among the first to eighth force detection cells CE1 to CE8 on the left curved portion of the display device 10, the first force detection cell CE1 and the second force detection cell CE2 may be utilized as a call button CB that the user presses to run a phone application. The third force detection cell CE3 and the fourth force detection cell CE4 may be utilized as a camera button CMB that the user presses to run a camera application. The fifth force detection cell CE5, the sixth force detection cell CE6, and the seventh force detection cell CE7 may be utilized as an Internet button IB that the user presses to run an Internet application.

When a force is sensed from the first force detection cell CE1 and the second force detection cell CE2 on the left curved portion of the display device 10, the main processor 710 may control the display device 10 so that a phone application is run. In addition, when a is force is sensed from the third force detection cell CE3 and the fourth force detection cell CE4 on the left curved portion of the display device 10, the main processor 710 may control the display device 10 so that a camera application is run. In this case, the main processor 710 may output vibration data to the second vibration generator 820 adjacent to the first to fourth force detection cells CE1, CE2, CE3, and CE4 on the left curved portion of the display device 10 so that the second vibration generator 820 vibrates. As another example, the main processor 710 may output the vibration data to the second vibration generator 820 closest to the position of the user's touch so that the second vibration generator 820 vibrates in response to the touch data input from the touch driver 220.

In addition, when a force is sensed from the fifth force detection cell CE5, the sixth force detection cell CE6, and the seventh force detection cell CE7 on the left curved portion of the display device 10, the main processor 710 may control the display device 10 so that an Internet application is run. In this case, the main processor 710 may output vibration data to the fourth vibration generator 840 adjacent to the fifth to seventh force detection cells CE5, CE6, and CE7 on the left curved portion of the display device 10 so that the fourth vibration generator 840 vibrates. As another example, the main processor 710 may output the vibration data to the fourth vibration generator 840 closest to the position of the user's touch so that the fourth vibration generator 840 vibrates in response to the touch data input from the touch driver 220.

It is to be understood that the exemplary embodiment described in association with FIG. 15A is merely one example, and thus, exemplary embodiments are not limited thereto. That is to say, in response to a force applied to the first to seventh force detection cells CE1 to CE7 of the first force sensor 510 on the right curved portion of the display device 10 and the first to seventh force detection cells CE1 to CE7 of the second force sensor 520 on the left curved is portion of the display device 10, various functions including or excluding the above-described functions may be run. Additionally, the main processor 710 may be programmed so that different operations are run when a force is applied to each of the first to seventh force detection cells CE1 to CE7 of the first force sensor 510 on the right curved portion of the display device 10 and each of the first to seventh force detection cells CE1 to CE7 of the second force sensor 520 on the left curved portion of the display device 10.

The eighth force detection cell CE8 on each of the left curved portion and the right curved portion of the display device 10 may be utilized as a squeezing sensing button SB. The squeezing force applied to the eighth force detection cell CE8 may be higher and larger than the force applied to the first to seventh force detection cells CE1 through CE7. When a squeezing force is sensed from the eighth force detection cell CE8 on each of the left curved portion and the right curved portion, the main processor 710 may control the display device 10 so that a predetermined application or operation is performed.

For example, when a squeezing force is sensed from the eighth force detection cell CE8 on each of the left curved portion and the right curved portion, the main processor 710 may control the display device 10 so that it is turned on from a sleep mode. In this case, the main processor 710 may output vibration data to the third vibration generator 830 adjacent to the eighth force detection cell CE8 on the right curved portion so that the third vibration generator 830 vibrates. In addition, the main processor 710 may output vibration data to the fourth vibration generator 840 adjacent to the eighth force detection cell CE8 on the left curved portion so that the fourth vibration generator 840 vibrates.

As described in association with FIGS. 15A and 15B, the first force sensor 510 and the second force sensor 520 are disposed in the second areas DR2 corresponding to the is curved portions of the display device 10, such that the first force sensor 510 and the second force sensor 520 may be utilized on behalf of physical buttons such as a volume control button, a power button, a call button, a camera button, an Internet button, and a squeezing sensing button.

In addition, when there is a user's input from an input device, one of the first vibration generator 810, the second vibration generator 820, the third vibration generator 830, and the fourth vibration generator 840 that is closest to the input device may vibrate, so that the vibration generates only at the position to provide a haptic feedback. Although FIGS. 15A and 15B show the first and second force sensors 510 and 520 and the touch sensing device 200 as the input devices, exemplary embodiments are not limited thereto. For example, a fingerprint recognition sensor or a camera device 720 may be employed as the input device. For example, when there is a user's fingerprint recognition by a fingerprint recognition sensor, one of the first vibration generator 810, the second vibration generator 820, the third vibration generator 830, and the fourth vibration generator 840 that is closest to the fingerprint recognition sensor may vibrate, so that a haptic feedback can be provided. As another example, when there is a user's iris recognition by the camera device 720, one of the first vibration generator 810, the second vibration generator 820, the third vibration generator 830, and the fourth vibration generator 840 may vibrate, so that a haptic feedback can be provided.

Figure 16:
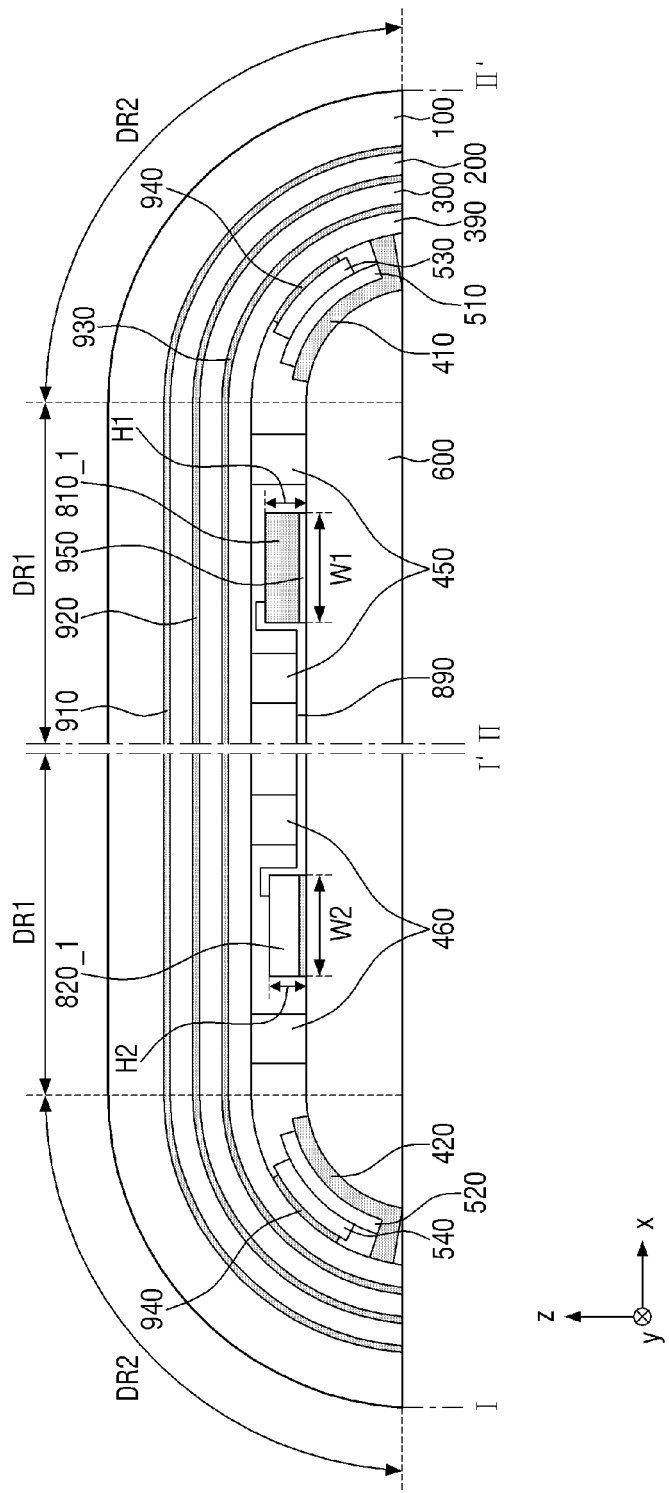
FIG. 16 is a cross-sectional view of another example of the display panel attached the cover window of FIGS. 3 and 4 taken along sectional lines I-I' and II-II' according to some exemplary embodiments.

FIG. 16 is a cross-sectional view of another example of the display panel attached the cover window of FIGS. 3 and 4 taken along sectional lines I-I' and II-II' according to some exemplary embodiments.

The exemplary embodiment shown in FIG. 16 is different from the exemplary embodiment shown in FIG. 13 in that the height H1 and width W1 of the first vibration generator 810_1 are different from the height H2 and the width W2 of the second vibration generator 820_1. The elements of FIG. 16 identical to those of FIG. 13 will not be described to avoid redundancy.

Referring to FIG. 16, the height H1 of the first vibration generator 810_1 may be higher than the height H2 of the second vibration generator 820_1, and the width W1 of the first vibration generator 810_1 may be wider than the width W2 of the second vibration generator 820_1. As a result, the volume of the first vibration generator 810_1 may be larger than the volume of the second vibration generator 820_1. Therefore, when the first driving voltage and the second driving voltage, which have the same level, are applied to the first vibration generator 810_1 and the second vibration generator 820_1, the intensity of the vibration generated by the first vibration generator 810_1 may be greater than the intensity of vibration generated by the second vibration generator 820_1.

As described in association with FIG. 16, the intensity of the vibration of the vibration generators can be adjusted by increasing the height and width of the vibration generators without increasing the first driving voltage and the second driving voltage.

Figure 17:
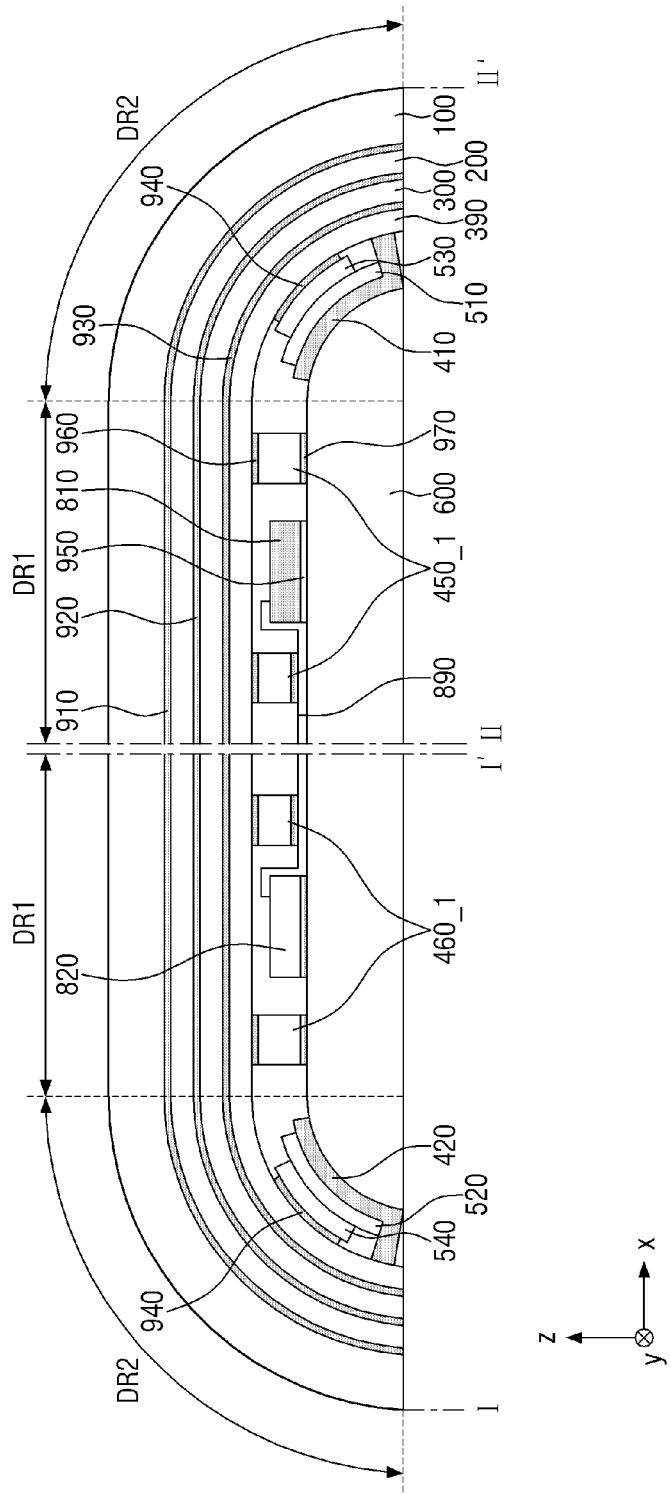
FIG. 17 is a cross-sectional view of another example of the display panel attached the cover window of FIGS. 3 and 4 taken along sectional lines I-I' and II-II' according to some exemplary embodiments.

FIG. 17 is a cross-sectional view of another example of the display panel attached the cover window of FIGS. 3 and 4 taken along sectional lines I-I' and II-IF according to some exemplary embodiments.

The exemplary embodiment shown in FIG. 17 is different from the exemplary embodiment shown in FIG. 13 in that the first electromagnetic wave shielding member 450_1 and the second electromagnetic wave shielding member 460_1 are made of steel instead of a waterproof member. The elements of FIG. 17 identical to those of FIG. 13 will not be described to avoid redundancy.

Referring to FIG. 17, when the first electromagnetic wave shielding member 450_1 is made of steel, it is possible to more effectively block the vibration generated by the first vibration generator 810 and the vibration generated by the second vibration generator 820 than by an electromagnetic wave shielding member made of the waterproof member. In addition, to prevent (e.g., effectively prevent) the vibration generated by the first vibration generator 810 from propagating to the surroundings, the first electromagnetic wave shielding member 450_1 may be higher than the first vibration generator 810.

When the first electromagnetic wave shielding member 450_1 is made of steel, a first adhesive layer 960 and a second adhesive layer 970 are used to attach it to the upper surface of the middle frame 600 and to the lower surface of the panel support member 390. The first adhesive layer 960 and the second adhesive layer 970 may be an optically cleared adhesive film (OCA) or an optically cleared resin (OCR).

The first electromagnetic wave shielding member 450_1 may be attached to the lower surface of the panel support member 390 through the first adhesive layer 960 and may be attached to the upper surface of the middle frame 600 through the second adhesive layer 970. When the fourth circuit board 890 is disposed on one side of the first vibration generator 810, the first electromagnetic wave shielding member 450_1 may be attached to the upper surface of the fourth circuit board 890 through the second adhesive layer 970.

As described in association with FIG. 17, the upper surface, the lower surface, and the side surfaces of the first vibration generator 810 are surrounded by the panel support member 390, the middle frame 600, and the first electromagnetic wave shielding member 450_1. Accordingly, it is possible to prevent the vibration generated by the first vibration generator 810 from propagating to the surroundings by the first electromagnetic wave shielding member 450_1.

The second electromagnetic wave shielding member 460_1 is substantially is identical to the first electromagnetic wave shielding member 450_1 except that the second electromagnetic wave shielding member 460_1 is disposed on (or near) the left edge of the lower surface of the panel support member 390, and, therefore, a redundant description will be omitted.

Figure 18:
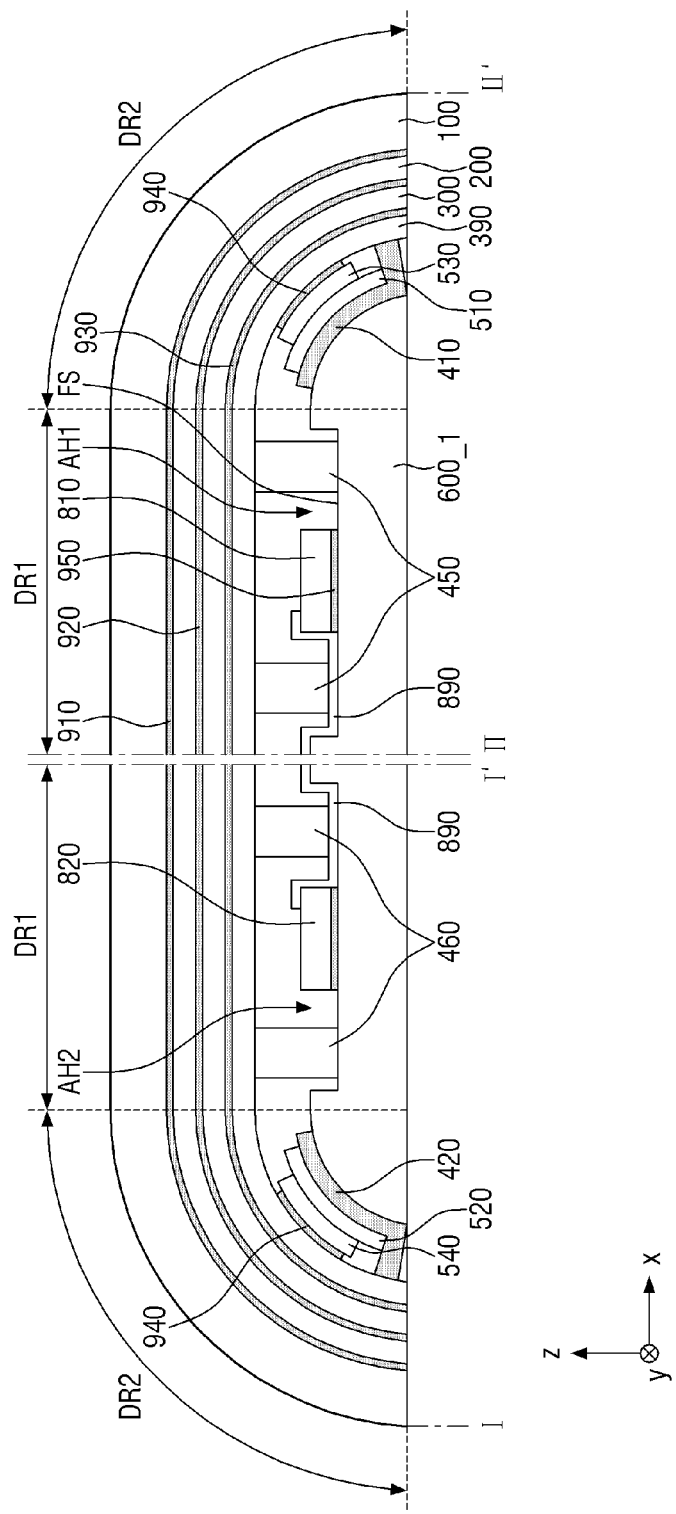
FIG. 18 is a cross-sectional view of another example of the display panel attached the cover window of FIGS. 3 and 4 taken along sectional lines I-I' and II-II' according to some exemplary embodiments.

FIG. 18 is a cross-sectional view of another example of the display panel attached the cover window of FIGS. 3 and 4 taken along sectional lines I-I' and II-IF according to some exemplary embodiments.

The exemplary embodiment shown in FIG. 18 is different from the exemplary embodiment shown in FIG. 13 in that a first vibration generator 810 and a first electromagnetic wave shielding member 450 are disposed in a first accommodating hole AH1 formed in the upper surface of the middle frame 600_1, and that a second vibration generator 820 and a second electromagnetic wave shielding member 460 are disposed in a second accommodating hole AH2 formed in the upper surface of the middle frame 600_1. The elements of FIG. 18 identical to those of FIG. 13 will not be described to avoid redundancy.

Referring to FIG. 18, a first accommodating hole AH1 and a second accommodating hole AH2 may be formed in the upper surface of the middle frame 600_1 that are recessed from the upper surface of the middle frame 600_1. The middle frame 600_1 may include a first area DR1 formed in a flat shape and second areas DR2 formed in a curved shape. The first accommodating hole AH1 and the second accommodating hole AH2 may be formed in the first area DR1.

The first vibration generator 810 and the first electromagnetic wave shielding member 450 may be disposed in the first accommodating hole AH1. The first vibration generator 810 may be attached to the floor surface FS of the first accommodating hole AH1.

The first electromagnetic wave shielding member 450 may be made of a waterproof member substantially identical to that of the first waterproof member 410. To prevent (e.g., effectively prevent) the vibration generated by the first vibration generator 810 from propagating to the surroundings, the first electromagnetic wave shielding member 450 may be higher than the first vibration generator 810. Accordingly, the first electromagnetic wave shielding member 450 may be attached to the floor surface FS of the first accommodating hole AH1 and the lower surface of the panel support member 390. When the fourth circuit board 890 is disposed on one side of the first vibration generator 810, the first electromagnetic wave shielding member 450 is attached to the lower surface of the panel support member 390 and the fourth circuit board 890.

As described in association with FIG. 18, the upper surface, the lower surface, and the side surfaces of the first vibration generator 810 are surrounded by the panel support member 390, the middle frame 600_1, and the first electromagnetic wave shielding member 450. Accordingly, it is possible to prevent the vibration generated by the first vibration generator 810 from propagating to the surroundings by the first electromagnetic wave shielding member 450.

The second vibration generator 820 and the second electromagnetic wave shielding member 460 are substantially identical to the first vibration generator 810 and the first electromagnetic wave shielding member 450, except that the second vibration generator 820 and the second electromagnetic wave shielding member 460 are disposed in the second accommodating hole AH2, and, therefore, a redundant description will be omitted.

Figure 19:
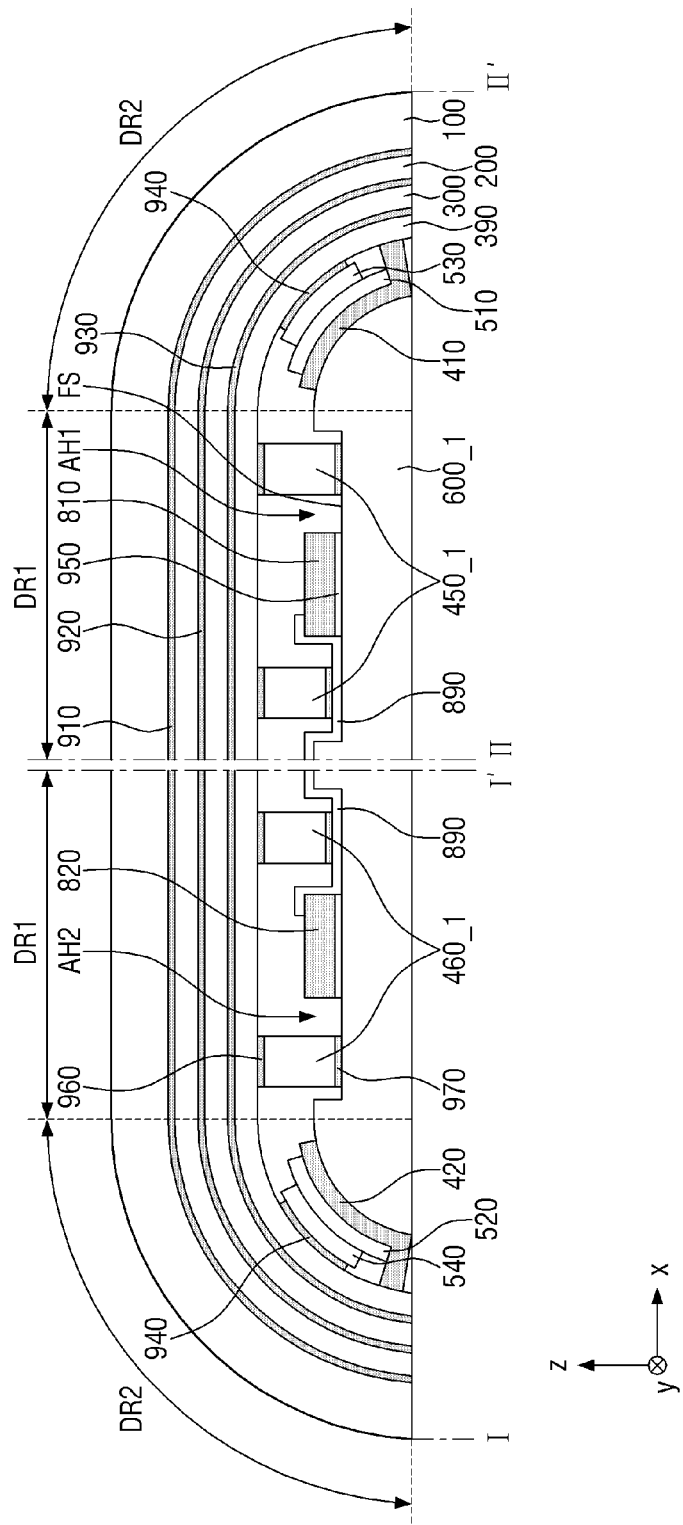
FIG. 19 is a cross-sectional view of another example of the display panel attached the cover window of FIGS. 3 and 4 taken along sectional lines I-I' and II-II' according to some exemplary embodiments.

FIG. 19 is a cross-sectional view of another example of the display panel attached the cover window of FIGS. 3 and 4 taken along sectional lines I-I' and II-IF according to some exemplary embodiments.

The exemplary embodiment shown in FIG. 19 is different from the exemplary is embodiment shown in FIGS. 17 and 18 in that a first vibration generator 810 and a first electromagnetic wave shielding member 450_1 are disposed in a first accommodating hole AH1 formed in the upper surface of the middle frame 600_1, and that a second vibration generator 820 and a second electromagnetic wave shielding member 460_1 are disposed in a second accommodating hole AH2 formed in the upper surface of the middle frame 600_1. The elements of FIG. 19 identical to those of FIGS. 17 and 18 will not be described to avoid redundancy.

Referring to FIG. 19, a first accommodating hole AH1 and a second accommodating hole AH2 may be formed in the upper surface of the middle frame 600_1 that are recessed from the upper surface of the middle frame 600_1.

The first vibration generator 810 and the first electromagnetic wave shielding member 450_1 may be disposed in the first accommodating hole AH1. The first vibration generator 810 may be attached to the floor surface FS of the first accommodating hole AH1.

The first electromagnetic wave shielding member 450_1 is made of steel, and thus, it is possible to more effectively block the vibration generated by the first vibration generator 810 and the vibration generated by the second vibration generator 820 than by the electromagnetic wave shielding member made of a waterproof member. In addition, in order to prevent (e.g., effectively prevent) the vibration generated by the first vibration generator 810 from propagating to the surroundings, the first electromagnetic wave shielding member 450_1 may be higher than the first vibration generator 810.

When the first electromagnetic wave shielding member 450_1 is made of steel, a first adhesive layer 960 and a second adhesive layer 970 are used to attach it to the upper surface of the middle frame 600_1 and to the lower surface of the panel support member 390. The first is adhesive layer 960 and the second adhesive layer 970 may be an optically cleared adhesive film (OCA) or an optically cleared resin (OCR).

The first electromagnetic wave shielding member 450_1 may be attached to the lower surface of the panel support member 390 through the first adhesive layer 960 and may be attached to the floor surface FS of the first accommodating hole AH1 through the second adhesive layer 970. When the fourth circuit board 890 is disposed on one side of the first vibration generator 810, the first electromagnetic wave shielding member 450_1 may be attached to the fourth circuit board 890 through the second adhesive layer 970.

As described in association with FIG. 19, the upper surface, the lower surface, and the side surfaces of the first vibration generator 810 are surrounded by the panel support member 390, the middle frame 600_1, and the first electromagnetic wave shielding member 450_1. As such, it is possible to prevent vibration generated by the first vibration generator 810 from propagating to the surroundings by the first electromagnetic wave shielding member 450_1.

The second electromagnetic wave shielding member 460_1 is substantially identical to the first electromagnetic wave shielding member 450_1, except that it is disposed in the accommodating hole AH2, and, therefore, a redundant description will be omitted.

Figure 20:
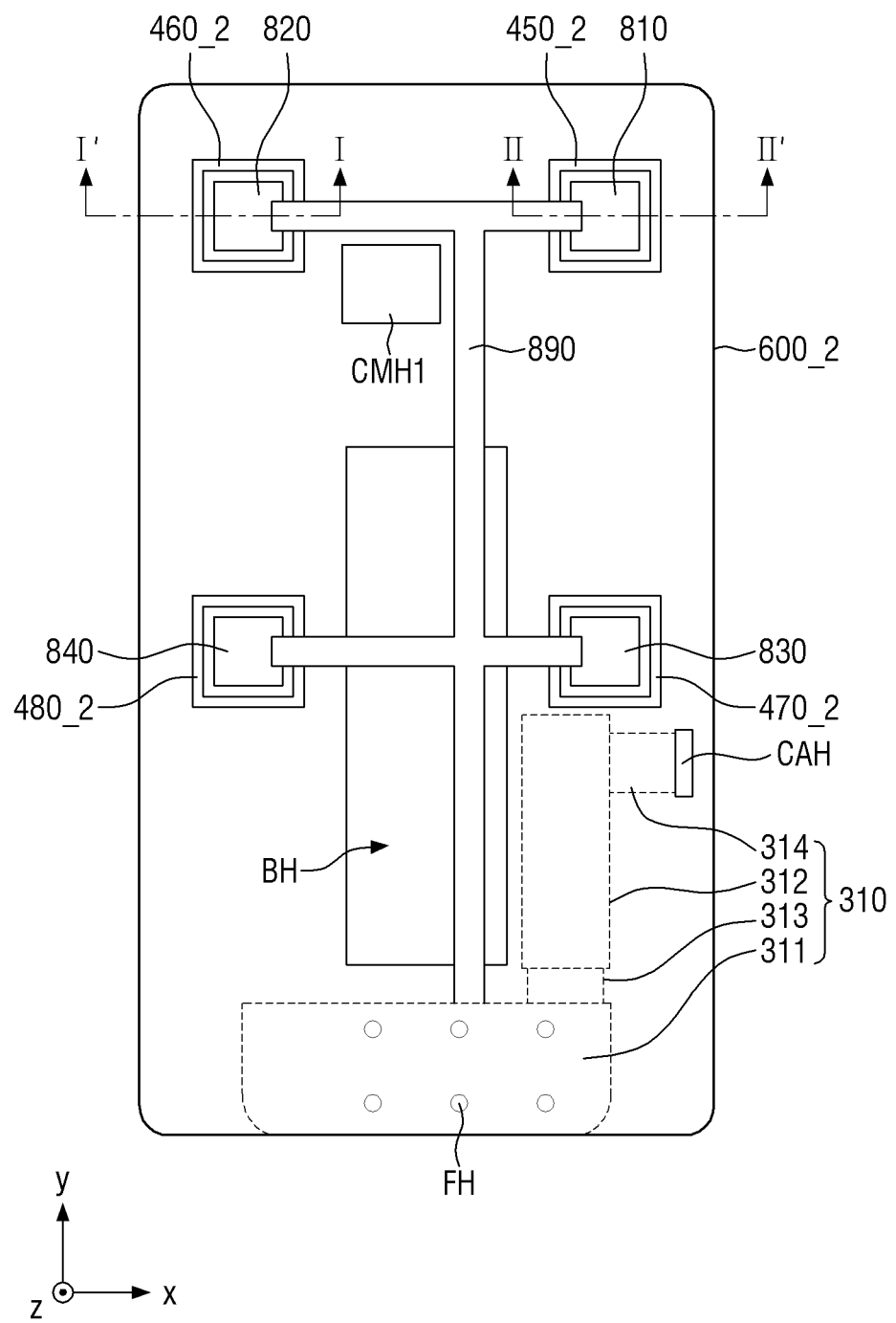
FIG. 20 is a plan view showing another example of a middle frame according to some exemplary embodiments.
Figure 21:
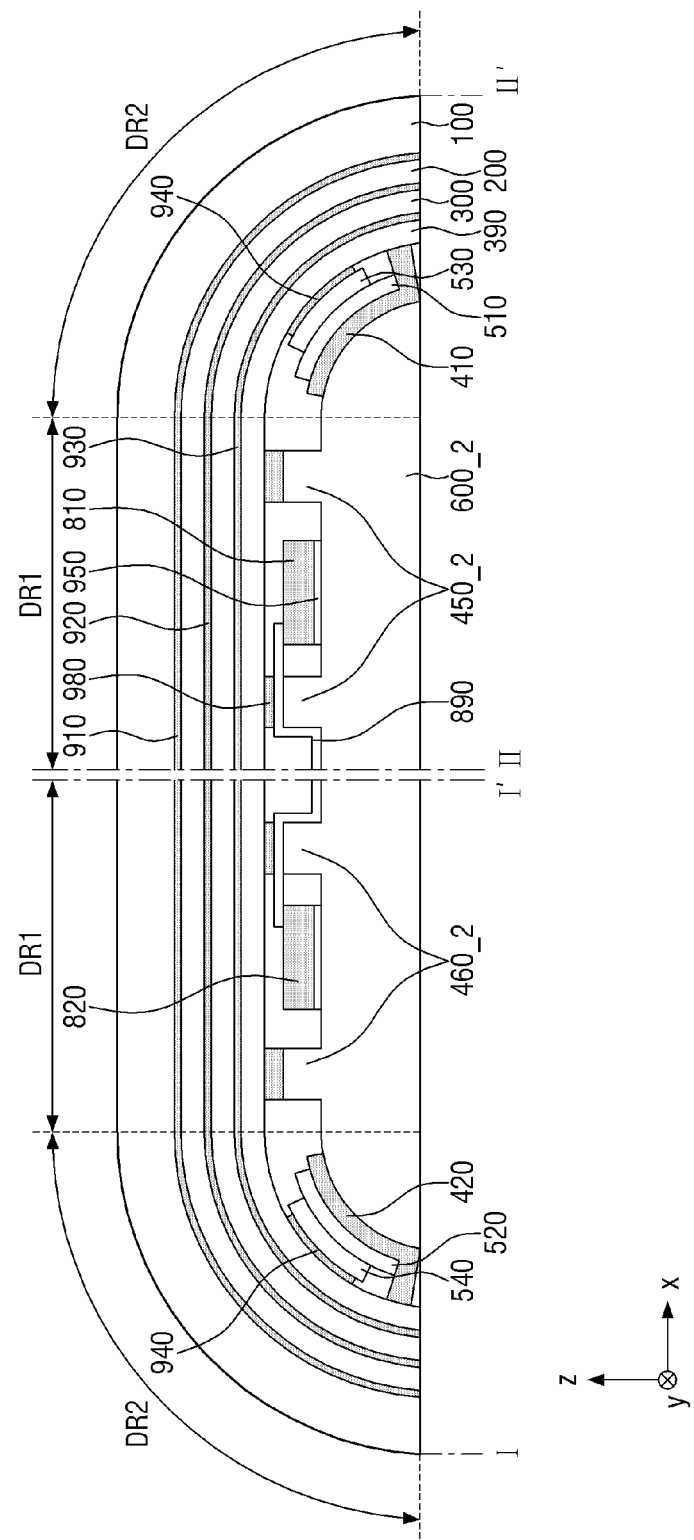
FIG. 21 is a cross-sectional view of the display panel attached the cover window of FIGS. 3 and 20 taken along sectional lines I-I' and II-II' according to some exemplary embodiments.

FIG. 20 is a plan view showing another example of a middle frame according to some exemplary embodiments. FIG. 21 is a cross-sectional view of the display panel attached the cover window of FIGS. 3 and 20 taken along sectional lines I-I' and II-IT' according to some exemplary embodiments.

The exemplary embodiment shown in FIGS. 20 and 21 is different from the exemplary embodiment shown in FIG. 13 in that a first electromagnetic wave shielding member 450_2 and a second electromagnetic wave shielding member 460_2 protrude from the upper is surface of the middle frame 600_2. The elements of FIGS. 20 and 21 identical to those of FIG. 13 will not be described to avoid redundancy.

Referring to FIGS. 20 and 21, the first electromagnetic wave shielding member 450_2 may protrude from the upper surface of the middle frame 600_2. To prevent (e.g., effectively prevent) the vibration generated by the first vibration generator 810 from propagating to the surroundings, the first electromagnetic wave shielding member 450_2 may be higher than the first vibration generator 810.

The first electromagnetic wave shielding member 450_2 may be attached to the lower surface of the panel support member 390 through a third adhesive layer 980. The third adhesive layer 980 may be an optically cleared adhesive film (OCA) or an optically cleared resin (OCR).

The fourth circuit board 890 may be disposed on the upper surface of the first electromagnetic wave shielding member 450_2 disposed on one side of the first vibration generator 810. The third adhesive layer 980 may be attached to the lower surface of the panel support member 390 and the fourth circuit board 890.

As described in association with FIGS. 20 and 21, the upper surface, the lower surface, and the side surfaces of the first vibration generator 810 are surrounded by the panel support member 390 of the display panel 300, the middle frame 600_2, and the first electromagnetic wave shielding member 450_2. Accordingly, it is possible to prevent the vibration generated by the first vibration generator 810 from propagating to the surroundings by the first electromagnetic wave shielding member 450_2.

As shown in FIGS. 20 and 21, the second electromagnetic wave shielding member 460_2, the third electromagnetic wave shielding member 470_2, and the fourth is electromagnetic wave shielding member 480_2 may also be substantially identical to the first electromagnetic wave shielding member 450_2, and, therefore, a redundant description will be omitted.

Figure 22:
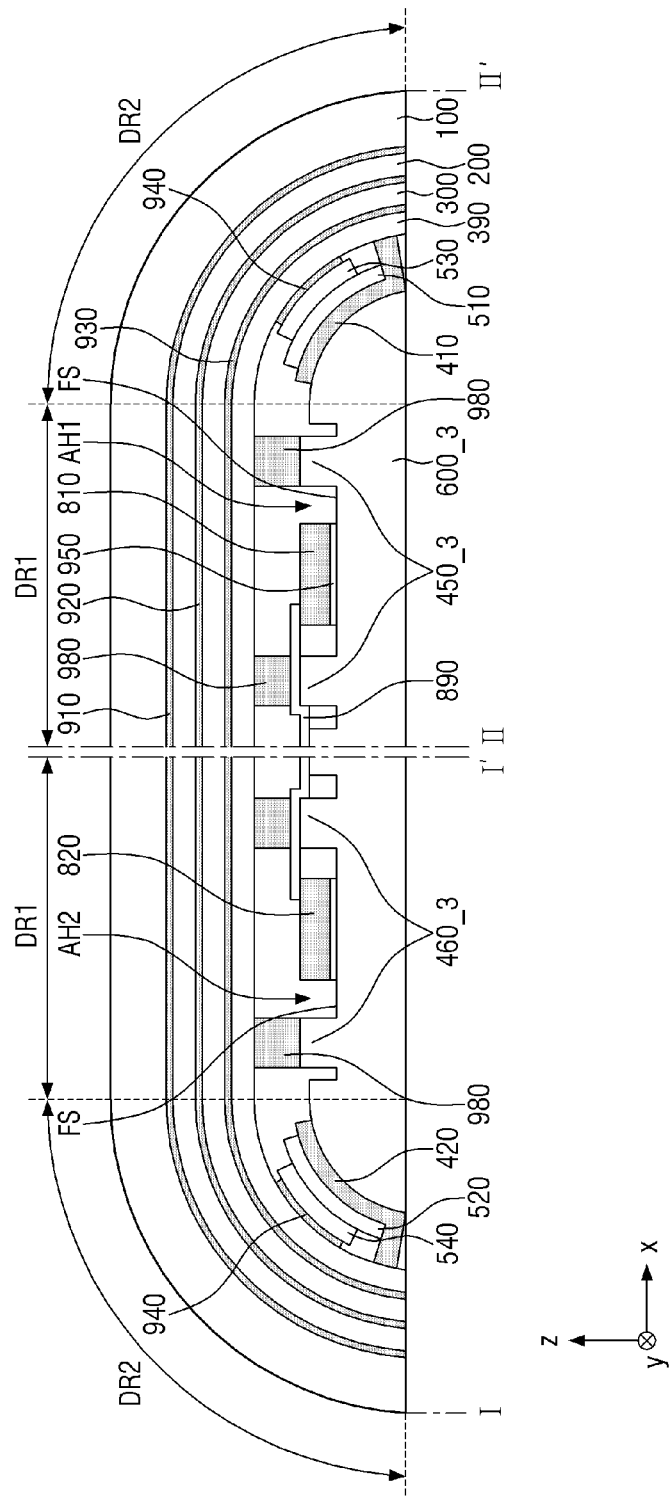
FIG. 22 is a cross-sectional view of another example of the display panel attached the cover window of FIGS. 3 and 20 taken along sectional lines I-I' and II-II' according to some exemplary embodiments.

FIG. 22 is a cross-sectional view of another example of the display panel attached the cover window of FIGS. 3 and 20 taken along sectional lines I-I' and II-II' according to some exemplary embodiments.

The exemplary embodiment shown in FIG. 22 is different from the exemplary embodiment shown in FIG. 19 in that a first electromagnetic wave shielding member 450_3 and a second electromagnetic wave shielding member 460_3 protrude from the floor surface FS of the first accommodating hole AH1 and the floor surface FS of the second accommodating hole AH2 of the middle frame 600_3. The elements of FIG. 22 identical to those of FIG. 19 will not be described to avoid redundancy.

Referring to FIG. 22, the first electromagnetic wave shielding member 450_3 may protrude from the floor surface FS of the first accommodating hole AH1 of the middle frame 600_3. To prevent (e.g., effectively prevent) the vibration generated by the first vibration generator 810 from propagating to the surroundings, the first electromagnetic wave shielding member 450_3 may be higher than the first vibration generator 810.

The first electromagnetic wave shielding member 450_3 may be attached to the lower surface of the panel support member 390 through a third adhesive layer 980. The third adhesive layer 980 may be an optically cleared adhesive film (OCA) or an optically cleared resin (OCR).

The fourth circuit board 890 may be disposed on the upper surface of the first electromagnetic wave shielding member 450_3 disposed on one side of the first vibration is generator 810. The third adhesive layer 980 may be attached to the lower surface of the panel support member 390 and the fourth circuit board 890.

As described in association with FIG. 22, the upper surface, the lower surface, and the side surfaces of the first vibration generator 810 are surrounded by the panel support member 390 of the display panel 300, the middle frame 600_3, and the first electromagnetic wave shielding member 450_3. Accordingly, it is possible to prevent the vibration generated by the first vibration generator 810 from propagating to the surroundings by the first electromagnetic wave shielding member 450_3.

In addition to as shown in FIG. 22, each of the second electromagnetic wave shielding member 460_3, the third electromagnetic wave shielding member 470_3, and the fourth electromagnetic wave shielding member 480_3 may also protrude from the floor surface of the accommodating hole of the middle frame 600_3, substantially identical to the first electromagnetic wave shielding member 450_3, and, therefore, a redundant description will be omitted.

Figure 23:
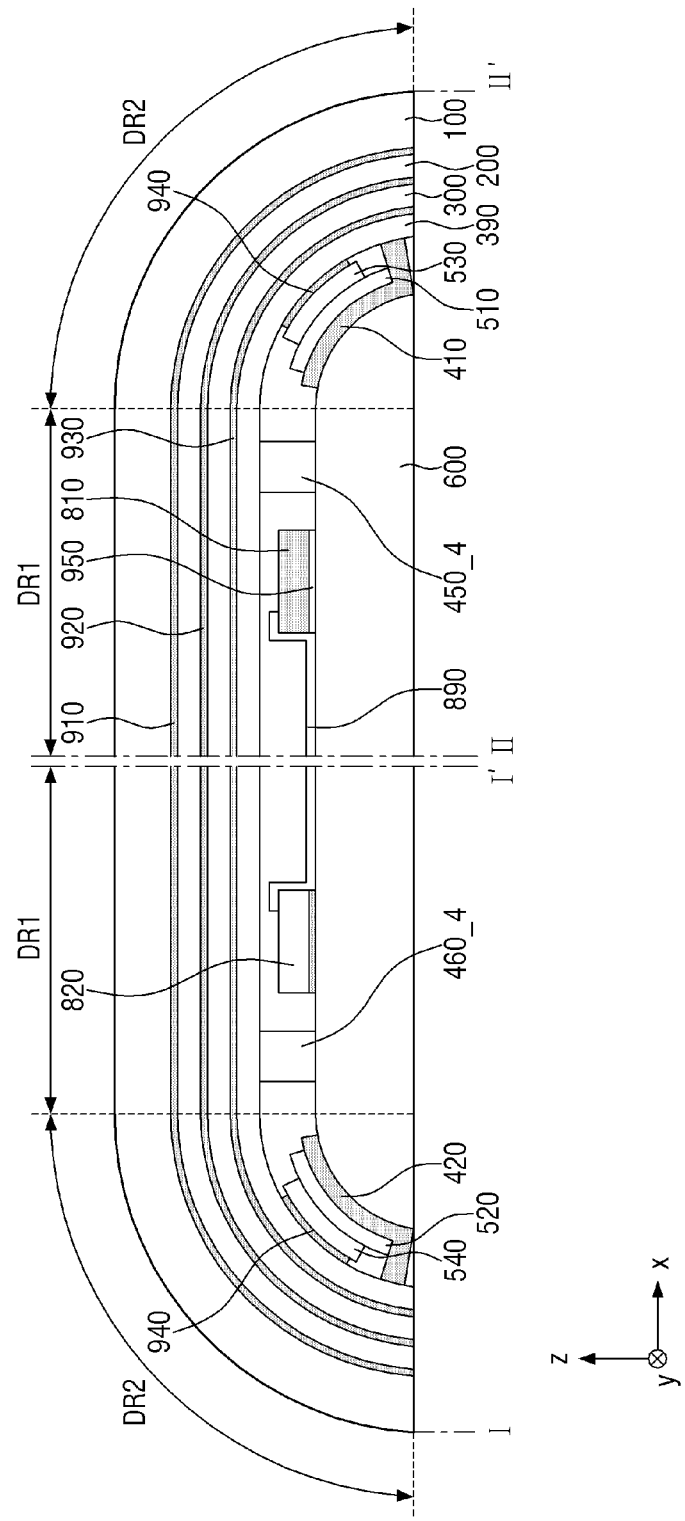
FIG. 23 is a cross-sectional view of another example of the display panel attached the cover window of FIGS. 3 and 20 taken along sectional lines I-I' and II-II' according to some exemplary embodiments.

FIG. 23 is a cross-sectional view of another example of the display panel attached the cover window of FIGS. 3 and 20 taken along sectional lines I-I' and II-II' according to some exemplary embodiments.

The exemplary embodiment shown in FIG. 23 is different from the exemplary embodiment shown in FIG. 13 in that each of the first electromagnetic wave shielding member 450_4 and the second electromagnetic wave shielding member 460_4 is removed from the region where the fourth circuit board 890 is disposed. The elements of FIG. 23 identical to those of FIG. 13 will not be described to avoid redundancy.

Referring to FIG. 23, a fourth circuit board 890 is disposed on one side surface and a part of the upper surface of a first vibration generator 810. Accordingly, to dispose the fourth circuit board 890, a part of the first electromagnetic wave shielding member 450_4 facing the side surface of the first vibration generator 810 may be removed.

In addition to as shown in FIG. 23, to dispose the fourth circuit board 890, a portion of the second electromagnetic wave shielding member 460_4, the third electromagnetic wave shielding member 470_4, and the fourth electromagnetic wave shielding member 480_4 may also be removed, as well as the portion of the first electromagnetic wave shielding member 450_4.

Figure 24:
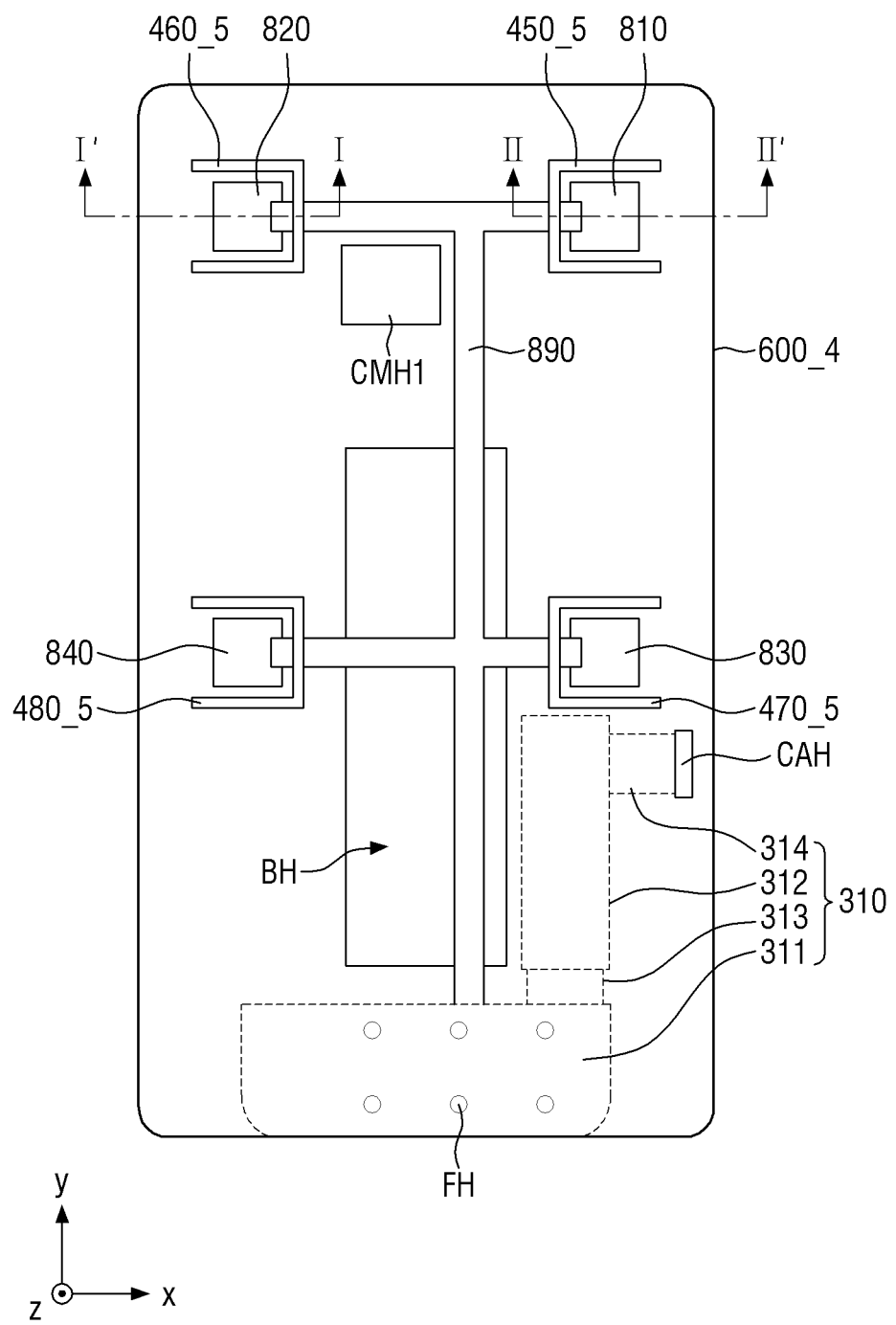
FIG. 24 is a plan view showing another example of a middle frame according to some exemplary embodiments.

FIG. 24 is a plan view showing another example of a middle frame according to some exemplary embodiments.

The exemplary embodiment shown in FIG. 24 is different from the exemplary embodiment shown in FIG. 4 in that a first electromagnetic wave shielding member 450_5 surrounds three side surfaces of the first vibration generator 810, a second electromagnetic wave shielding member 460_5 surrounds three side surfaces of the second vibration generator 820, a third electromagnetic wave shielding member 470_5 surrounds three side surfaces of the third vibration generator 830, and a fourth electromagnetic wave shielding member 480_5 surrounds three side surfaces of the fourth vibration generator 840. The elements of FIG. 24 identical to those of FIG. 4 will not be described to avoid redundancy.

Referring to FIG. 24, a first electromagnetic wave shielding member 450_5 surrounds the side surfaces of the first vibration generator 810, except the right side surface facing the first waterproof member 410. Accordingly, the vibration generated by the first vibration generator 810 can be propagated to the right end of the middle frame 600_4 without being blocked in the right side direction. In this case, since the first vibration generator 810 is is disposed on the right side of the middle frame 600_4, vibration can be generated only at the area from the first vibration generator 810 to the right end of the middle frame 600_4.

The second electromagnetic wave shielding member 460_5 surrounds the side surfaces of the second vibration generator 820, except the left side surface facing the second waterproof member 420. Accordingly, the vibration generated by the second vibration generator 820 can be propagated to the left end of the middle frame 600_4 without being blocked in the left side direction. In this case, since the second vibration generator 820 is disposed on the left side of the middle frame 600_4, vibration can be generated only at the area from the second vibration generator 820 to the left end of the middle frame 600_4.

The third electromagnetic wave shielding member 470_5 surrounds the side surfaces of the first vibration generator 810, except the right side surface facing the first waterproof member 420. Accordingly, the vibration generated by the third vibration generator 830 can be propagated to the right end of the middle frame 600_4 without being blocked in the right side direction. In this case, since the third vibration generator 830 is disposed on the right side of the middle frame 600_4, vibration can be generated only at the area from the third vibration generator 830 to the right end of the middle frame 600_4.

The fourth electromagnetic wave shielding member 480_5 surrounds the side surfaces of the fourth vibration generator 840, except the left side surface facing the second waterproof member 420. Accordingly, the vibration generated by the fourth vibration generator 840 can be propagated to the left end of the middle frame 600_4 without being blocked in the left side direction. In this case, since the fourth vibration generator 840 is disposed on the left side of the middle frame 600_4, vibration can be generated only at the area from the fourth vibration generator 840 to the left end of the middle frame 600_4.

As described in association with FIG. 24, when the vibration generators are disposed on the sides of the middle frame, by disposing the electromagnetic wave shielding member to surround the side surfaces of each of the vibration generators except the side surface facing the side end of the middle frame, vibration can be generated only in the limited positions.

Figure 25:
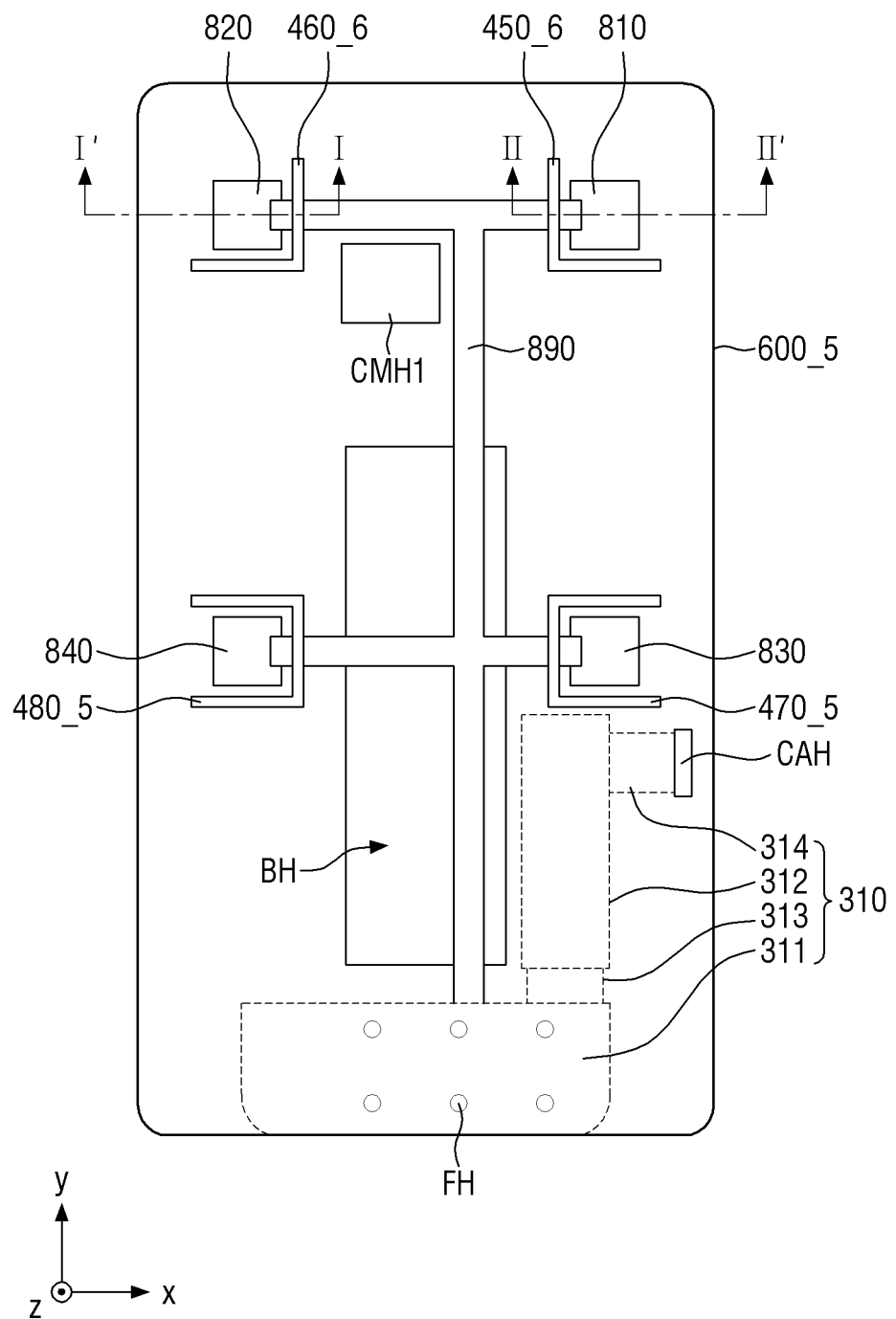
FIG. 25 is a plan view showing another example of a middle frame according to some exemplary embodiments.

FIG. 25 is a plan view showing another example of a middle frame according to some exemplary embodiments.

The exemplary embodiment shown in FIG. 25 is different from the exemplary embodiment shown in FIG. 24 in that a first electromagnetic wave shielding member 450_6 surrounds two side surfaces of the first vibration generator 810, and a second electromagnetic wave shielding member 460_6 surrounds two side surfaces of the second vibration generator 820. The elements of FIG. 25 identical to those of FIG. 24 will not be described to avoid redundancy.

Referring to FIG. 25, the first electromagnetic wave shielding member 450_6 surrounds the side surfaces of the first vibration generator 810 except its right side surface and upper side surface facing the right end and the upper end of the middle frame 600_5, respectively. Accordingly, the vibration generated by the first vibration generator 810 can be propagated to the right end and the upper end of the middle frame 600_5 without being blocked in the right side direction and in the upper side direction. Since the first vibration generator 810 is disposed on the upper right side of the middle frame 600_5, vibration may be generated only in the area from the first vibration generator 810 to the right end and to the upper end of the middle frame 600_5.

In addition, the second electromagnetic wave shielding member 460_6 surrounds the side surfaces of the second vibration generator 820, except its left side surface and upper side is surface facing the left end and the upper end of the middle frame 600_5, respectively. As such, the vibration generated by the second vibration generator 820 can be propagated to the left end and the upper end of the middle frame 600_5 without being blocked in the left side direction and in the upper side direction. Since the second vibration generator 820 is disposed adjacent the upper left corner of the middle frame 600_5, vibration may be generated only in the area from the second vibration generator 820 to the left end and to the upper end of the middle frame 600_5.

Figure 26:
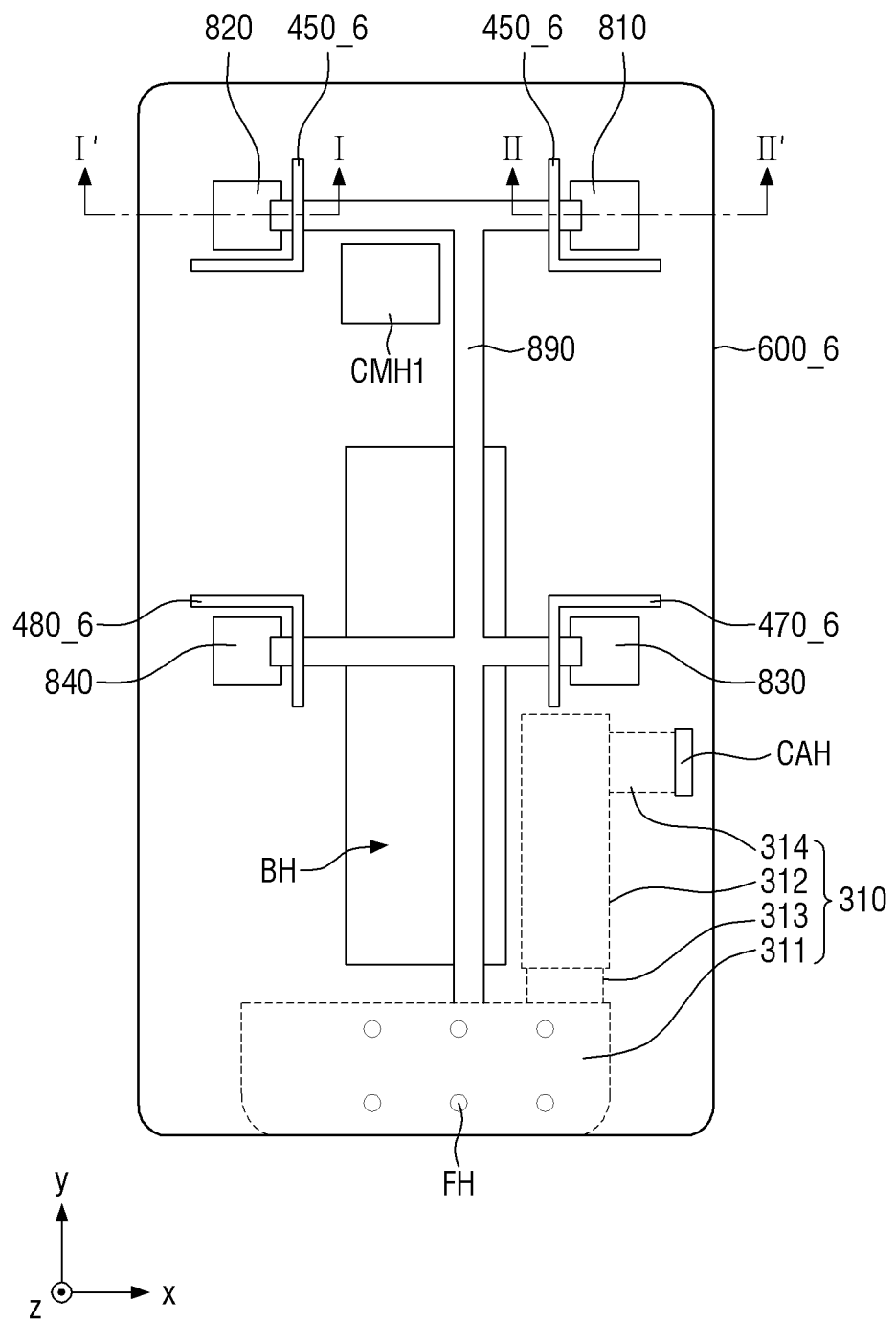
FIG. 26 is a plan view showing another example of a middle frame according to some exemplary embodiments.

FIG. 26 is a plan view showing another example of a middle frame according to some exemplary embodiments.

The exemplary embodiment shown in FIG. 26 is different from the exemplary embodiment shown in FIG. 25 in that a third electromagnetic wave shielding member 470_6 surrounds two side surfaces of the third vibration generator 830, and a fourth electromagnetic wave shielding member 480_6 surrounds two side surfaces of the fourth vibration generator 840. The elements of FIG. 26 identical to those of FIG. 25 will not be described to avoid redundancy.

Referring to FIG. 26, the third electromagnetic wave shielding member 470_6 surrounds the side surfaces of the third vibration generator 830, except its right side surface and lower side surface facing the right end and the lower end of the middle frame 600_6, respectively. Accordingly, the vibration generated by the third vibration generator 830 can be propagated to the right end and the lower end of the middle frame 600_6 without being blocked in the right side direction and in the lower side direction. Accordingly, vibration can be generated only at the area from the third vibration generator 830 to the right end and to the lower end of the middle frame 600_6.

In addition, the fourth electromagnetic wave shielding member 480_6 surrounds is the side surfaces of the fourth vibration generator 840, except its left side surface and lower side surface facing the left end and the lower end of the middle frame 600_6, respectively. As such, the vibration generated by the fourth vibration generator 840 can be propagated to the left end and the lower end of the middle frame 600_6 without being blocked in the left side direction and in the lower side direction. Accordingly, vibration can be generated only at the area from the fourth vibration generator 840 to the left end and to the lower end of the middle frame 600_6.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
    a display panel comprising:
        an upper surface; and
        a lower surface opposing the upper surface;
    a middle frame disposed under the lower surface of the display panel;
    a first force sensor disposed under the lower surface of the display panel;
    a first vibration generator disposed on a first upper surface of the middle frame, under the lower surface of the display panel, and adjacent to the first force sensor; and
    a first electromagnetic wave shielding member outside at least one side surface of the first vibration generator,
    wherein, in a direction perpendicular to the lower surface of the display panel, the first electromagnetic wave shielding member is between the lower surface of the display panel and the first upper surface of the middle frame.

2. The display device of claim 1, wherein an upper surface of the first electromagnetic wave shielding member is closer to the display panel than an upper surface of the first vibration generator.

3. The display device of claim 1, further comprising:
    a first adhesive layer attached to the first electromagnetic wave shielding member, the first adhesive layer being between the lower surface of the display panel and the first electromagnetic wave shielding member; and
    a second adhesive layer attached to the first electromagnetic wave shielding member and the first upper surface of the middle frame.

4. The display device of claim 1, wherein:
    the first electromagnetic wave shielding member is integrally formed with and protrudes from the first upper surface of the middle frame; and
    the display device further comprises a third adhesive layer attached to the first electromagnetic wave shielding member, the third adhesive layer being between the lower surface of the display panel and the first electromagnetic wave shielding member.

5. The display device of claim 1, wherein the first vibration generator and the first electromagnetic wave shielding member are accommodated in a first accommodating hole formed in a second upper surface of the middle frame, the second upper surface of the middle frame being closer to the display panel than the first upper surface of the middle frame.

6. The display device of claim 5, wherein the first electromagnetic wave shielding member is between the lower surface of the display panel and a floor surface of the first accommodating hole, the floor surface of the first accommodating hole corresponding to the first upper surface of the middle frame.

7. The display device of claim 5, further comprising:
    a first adhesive layer attached to the first electromagnetic wave shielding member, the first adhesive layer being between the lower surface of the display panel and the first electromagnetic wave shielding member; and
    a second adhesive layer attached to the first electromagnetic wave shielding member and the floor surface of the first accommodating hole.

8. The display device of claim 5, wherein the first electromagnetic wave shielding member is integrally formed with the middle frame and protrudes from the floor surface of the first accommodating hole.

9. The display device of claim 1, wherein the first vibration generator is configured to vibrate in response to detection of a force via the first force sensor.

10. The display device of claim 1, further comprising:
    a second force sensor disposed under the display panel;
    a second vibration generator disposed under the display panel and adjacent to the second force sensor; and
    a second electromagnetic wave shielding member surrounding side surfaces of the second vibration generator.

11. The display device of claim 10, wherein:
    the first force sensor is disposed closer to a first side end of the display panel than the first vibration generator; and
    the second force sensor is disposed closer to a second side end of the display panel than the second vibration generator, the second side end being different from the first side end.

12. The display device of claim 10, wherein:
    the first vibration generator is configured to vibrate in response to detection of a force via the first force sensor; and
    the second vibration generator is configured to vibrate in response to detection of a force via the second force sensor.

13. The display device of claim 10, wherein a height or width of the first vibration generator is different from a height or width of the second vibration generator.

14. The display device of claim 1, further comprising:
    a third vibration generator disposed under the display panel and adjacent to the first force sensor; and
    a third electromagnetic wave shielding member surrounding side surfaces of the third vibration generator.

15. The display device of claim 14, wherein:
    the first force sensor comprises a plurality of force detection cells;
    the first vibration generator is disposed adjacent to one of the plurality of force detection cells; and
    the third vibration generator is disposed adjacent to another one of the plurality of force detection cells.

16. The display device of claim 15, wherein:
    the first vibration generator is configured to vibrate in response to detection of a force via one of the plurality of force detection cells; and
    the third vibration generator is configured to vibrate in response to detection of a force via another one of the plurality of force detection cells.

17. The display device of claim 1, further comprising:
    a first waterproof member disposed under the first force sensor.

18. The display device of claim 17, wherein the first waterproof member faces one side surface of the first electromagnetic wave shielding member.

19. The display device of claim 17, wherein the first electromagnetic wave shielding member surrounds at least two side surfaces of the first vibration generator, except one side surface of the first vibration generator.

20. A comprising:
   a display panel comprising:
      an upper surface; and
      a lower surface opposing the upper surface;
   a middle frame disposed under the lower surface of the display panel;
   a first force sensor disposed under the lower surface of the display panel;
   a first vibration generator disposed on an upper surface of the middle frame, under the display panel, and adjacent to the first force sensor;
   a circuit board connected to a first pad electrode and a second pad electrode of the first vibration generator;
   a first electromagnetic wave shielding member outside at least one side surface of the first vibration generator,
   wherein:
      the first electromagnetic wave shielding member is disposed on the circuit board;
      the circuit board is disposed on the upper surface of the middle frame; and
      the first electromagnetic wave shielding member is disposed between the circuit board and the display panel.

21. The display device of claim 20, wherein, in the direction perpendicular to the lower surface of the display panel, the circuit board is between the lower surface of the display panel and each of the first vibration generator and the middle frame.

22. The display device of claim 20, wherein, in the direction perpendicular to the lower surface of the display panel, the circuit board is between the lower surface of the display panel and each of the first vibration generator and the first electromagnetic wave shielding member.

23. A display device comprising:
   an input device configured to receive an input from a user;
   a display panel configured to display an image;
   a first vibration generator disposed under the display panel; and
   a first electromagnetic wave shielding member outside at least one side surface of the first vibration generator, the first electromagnetic wave shielding member comprising metal,
   wherein the first vibration generator is configured to vibrate in response to reception of the input via the input device.

* * * * *